US011185857B2

(12) United States Patent
Eason et al.

(10) Patent No.: US 11,185,857 B2
(45) Date of Patent: Nov. 30, 2021

(54) FLUID FLOW DEVICE AND METHOD FOR MAKING THE SAME

(71) Applicant: University of Southampton, Southampton (GB)

(72) Inventors: Robert Eason, Southampton (GB); Collin Sones, Southampton (GB); Ioannis Katis, Southampton (GB); Peijun He, Southampton (GB)

(73) Assignee: University of Southampton, Southampton (GB)

(*) Notice: Subject to any disclaimer, the term of this patent is extended or adjusted under 35 U.S.C. 154(b) by 152 days.

(21) Appl. No.: 16/306,255

(22) PCT Filed: May 10, 2017

(86) PCT No.: PCT/GB2017/051288
§ 371 (c)(1),
(2) Date: Nov. 30, 2018

(87) PCT Pub. No.: WO2017/207958
PCT Pub. Date: Dec. 7, 2017

(65) Prior Publication Data
US 2019/0168217 A1 Jun. 6, 2019

(30) Foreign Application Priority Data
Jun. 2, 2016 (GB) .................................... 1609675

(51) Int. Cl.
*G03F 7/20* (2006.01)
*G03F 7/095* (2006.01)
(Continued)

(52) U.S. Cl.
CPC ....... *B01L 3/502707* (2013.01); *B01L 3/5023* (2013.01); *D21H 25/06* (2013.01);
(Continued)

(58) Field of Classification Search
CPC ............. B01L 3/502707; B01L 3/5023; B01L 2300/126; B01L 2200/12; B01L 2300/12;
(Continued)

(56) References Cited

U.S. PATENT DOCUMENTS 10,682,643 B2 * 6/2020 Sones .................... D21H 25/04
10,794,905 B2 * 10/2020 Sones .................. G01N 33/558
(Continued)

FOREIGN PATENT DOCUMENTS

CN 103437240 A 12/2013
CN 104475178 A 4/2015
(Continued)

OTHER PUBLICATIONS

Sones et al., "Laser-induced photo-polymerization for creation of paper-based fluidic devices" Lab Chip, 14 pp. 4567-4574 (2014).*
(Continued)

*Primary Examiner* — Martin J Angebranndt
(74) *Attorney, Agent, or Firm* — Renner, Otto, Boisselle & Sklar, LLP

(57) ABSTRACT

Techniques for making fluid flow devices are described. The technique is based on radiation-induced conversion of a radiation-sensitive substance from a first state to a second state. With adjustment of the radiation parameters such as power and scan speed we can control the depths of barriers that are formed within a substrate which can produce 3D flow paths. We have used this depth-variable patterning protocol for stacking and sealing of multilayer substrates, for assembly of backing layers for two-dimensional (2D) lateral flow devices and for fabrication of 3D devices. Since the 3D flow paths can be formed via a single laser-writing process by controlling the patterning parameters, this is a distinct improvement over other methods that require multiple complicated and repetitive assembly procedures.

3 Claims, 7 Drawing Sheets

(51) Int. Cl.
- *D21H 25/06* (2006.01)
- *B01L 3/00* (2006.01)
- *G03F 7/00* (2006.01)

(52) U.S. Cl.
CPC ............ *G03F 7/0015* (2013.01); *G03F 7/095* (2013.01); *G03F 7/0955* (2013.01); *G03F 7/2006* (2013.01); *G03F 7/2053* (2013.01); *G03F 7/704* (2013.01); *G03F 7/70025* (2013.01); *G03F 7/70383* (2013.01); *B01L 2200/12* (2013.01); *B01L 2300/126* (2013.01)

(58) Field of Classification Search
CPC .. G01N 33/558; G01N 33/523; G01N 33/526; G01N 33/543; G01N 21/77; C12Q 1/48; D21H 25/06; G03F 7/0015; G03F 7/0037; G03F 7/095; G03F 7/0955; G03F 7/2053
See application file for complete search history.

(56) References Cited

U.S. PATENT DOCUMENTS

| | | | |
|---|---|---|---|
| 2004/0265182 A1* | 12/2004 | Chen | B01D 67/003 422/503 |
| 2009/0298191 A1* | 12/2009 | Whitesides | B01L 3/502715 436/164 |
| 2013/0034869 A1* | 2/2013 | Whitesides | B01L 3/502738 435/7.92 |
| 2014/0174994 A1* | 6/2014 | Bemate | B03B 5/28 209/155 |
| 2016/0089672 A1* | 3/2016 | Chisholm | G03F 7/032 422/503 |
| 2016/0139102 A1 | 5/2016 | McCord | |
| 2018/0120312 A1* | 5/2018 | Sones | G01N 33/558 |
| 2021/0055295 A1* | 2/2021 | Eason | G01N 33/54386 |

FOREIGN PATENT DOCUMENTS

| | | | | |
|---|---|---|---|---|
| EP | 13267 | * | 12/1979 | |
| GB | 2 527 779 | A | 1/2016 | |
| GB | 2527779 | A | 1/2016 | |
| JP | 2012-230125 | * | 11/2012 | ........... G01N 33/588 |
| WO | 2008/049083 | A3 | 4/2008 | |
| WO | 2010/022324 | A2 | 2/2010 | |
| WO | 2010022324 | * | 2/2010 | |
| WO | 2012/125781 | A3 | 9/2012 | |
| WO | 2012/0160857 | * | 11/2012 | ............. G01N 35/08 |
| WO | 2012/160857 | A1 | 11/2012 | |
| WO | 2015/173543 | A1 | 11/2015 | |
| WO | 2016/178013 | A1 | 11/2016 | |

OTHER PUBLICATIONS

Carrilho et al. "Paper Microzone Plates", Anal. Chem., vol. 81(15) pp. 5990-5998 (Aug. 2009).*
Wu et al. "Low-cost, high-throughout fabrication of a cloth-based microfluidic devices using a photolithographical patterning technique" Lab Chip., vol. 15 pp. 1598-1608 (2015).*
Lv et al., "Integrated optofluidic-microfluidic twin channels: toward diverse application of lab-on-a-chip systems", Nature Sci. Report., vol. 6, article 19801 (Jan. 2016).*
Martinez et al., "Diagnostics for the developing world: microfluidic paper based analytical devices", Anal. Chem., vol. 82(1) pp. 3-10 (Jan. 2010).*
Lee et al., "innovative SU-8 lithography techniques and their applications", Micromachines vol. 6 pp. 1-18 (Dec. 2014).*
Yu et al., "Fabrication of three dimensional microstructures based on single-layered SU-8 for Lab-no-chip applications", Sensors Actuators A vol. 127 pp. 228-234 (Oct. 2005).*
Machine translation of WO 2012160857 (2012).*
Camplisson et al., "Two-ply channels for faster wicking in paper based microfluidic devices" Lab Chip, vol. 15 pp. 4461-4466 (2015).*
He et al., "Engineering fluidic delays in paper based devices using laser direct writing", Lab Chip vol. 15(20) pp. 4054-4061 (Oct. 2015).*
Sun et al., "Design and fabrication of microfluidic channel using dry film photoresist for air sampling application" Proc. ICSICT2014, pp. 1-3 Guilin, China (presented Oct. 2014).*
Lange, "Reinventing protein microarrays multiplexed analysis in clinical samples" Thesis ETH Zurich No. 22761 (121 pages) (2015).*
Machine translation of EP 13267 (Dec. 1979).*
International Search Report and Written Opinion for corresponding Patent Application No. PCT/GB2017/051288 dated Aug. 1, 2017.
European Search Report corresponding to Application No. GB 1609675.2 dated Nov. 30, 2016.
P. Yager, T. Edwards, E. Fu, K. Helton, K. Nelson, M. R. Tam, and B. H. Weigl, "Microfluidic diagnostic technologies for global public health," Nature 442, 412-418 (2006).
X. Li, D. R. Ballerini, and W. Shen, "A perspective on paper-based microfluidics: Current status and future trends," Biomicrofluidics 6, 11301-1130113 (2012).
R. Pelton, "Bioactive paper provides a low-cost platform for diagnostics," Trac-Trends Anal. Chem. 28, 925-942 (2009).
A. K. Yetisen, M. S. Akram, and C. R. Lowe, "Paper-based microfluidic point-of-care diagnostic devices," Lab Chip 13, 2210-2251 (2013).
A. W. Martinez, S. T. Phillips, M. J. Butte, and G. M. Whitesides, "Patterned paper as a platform for inexpensive, low-volume, portable bioassays," Angew. Chem.—Int. Edit. 46, 1318-1320 (2007).
D. A. Bruzewicz, M. Reches, and G. M. Whitesides, "Low-cost printing of poly(dimethylsiloxane) barriers to define microchannels in paper," Anal. Chem. 80, 3387-3392 (2008).
K. Abe, K. Suzuki, and D. Citterio, "Inkjet-printed microfluidic multianalyte chemical sensing paper," Anal. Chem. 80, 6928-6934 (2008).
X. Li, J. F. Tian, T. Nguyen, and W. Shen, "Paper-Based Microfluidic Devices by Plasma Treatment," Anal. Chem. 80, 9131-9134 (2008).
E. M. Fenton, M. R. Mascarenas, G. P. Lopez, and S. S. Sibbett, "Multiplex Lateral-Flow Test Strips Fabricated by Two-Dimensional Shaping," ACS Appl. Mater. Interfaces 1, 124-129 (2009).
Y. Lu, W. W. Shi, L. Jiang, J. H. Qin, and B. C. Lin, "Rapid prototyping of paper-based microfluidics with wax for low-cost, portable bioassay," Electrophoresis 30, 1497-1500 (2009).
E. Carrilho, A. W. Martinez, and G. M. Whitesides, "Understanding Wax Printing: A Simple Micropatterning Process for Paper-Based Microfluidics," Anal. Chem. 81, 7091-7095 (2009).
X. Li, J. F. Tian, G. Garnier, and W. Shen, "Fabrication of paper-based microfluidic sensors by printing," Colloid Surf. B-Biointerfaces 76, 564-570 (2010).
J. L. Delaney, C. F. Hogan, J. F. Tian, and W. Shen, "Electrogenerated Chemiluminscence Detection in Paper-Based Microfluidic Sensors," Anal. Chem. 83, 1300-1306 (2011).
J. Olkkonen, K. Lehtinen, and T. Erho, "Flexographically Printed Fluidic Structures in Paper," Anal. Chem. 82, 10246-10250 (2010).
W. Dungchai, O. Chailapakul, and C. S. Henry, "A low-cost, simple, and rapid fabrication method for paper-based microfluidics using wax screen-printing," Analyst 136, 77-82 (2011).
G. Chitnis, Z. W. Ding, C. L. Chang, C. A. Savran, and B. Ziaie, "Laser-treated hydrophobic paper: an expensive microfluidic platform," Lab Chip 11, 1161-1165.
C. L. Sones, I. N. Katis, P. J. W. He, B. Mills, M. F. Namiq, P. Shardlow, M. Ibsen and R. W. Eason, "Laser-induced photopolymerisation for creation of paper-based fluidic devices", Lab Chip 14 (Sep. 29, 2014), DOI: 10.1039/C4LC00850B.
P. J. W. He, I. N. Katis, R. W. Eason and C. L. Sones, Biomicrofluidics, 2015, 9, 10.
P. J. W. He, I. N. Katis, R. W. Eason and C. L. Sones, Lab Chip, 2015, 15, 4054-4061.
J. L. Osborn, B. Lutz, E. Fu, P. Kauffman, D. Y. Stevens and P. Yager, Lab Chip, 2010, 10, 2659-2665.
A.C. Siegel, S.T. Phillips, M. D. Dickey, N. S. Lu, Z. G. Suo and G. M. Whitesides, Adv. Funct. Mater., 2010, 20, 28-35.

(56) References Cited

OTHER PUBLICATIONS

D. Sechi, B. Greer, J. Johnson and N. Hashemi, Anal. Chem., 2013, 85, 10733-10737.

N. Hashemi, J. S. Erickson, J. P. Golden and F. S. Ligler, Biomicrofluidics, 2011, 5, 9.

N. Hashemi, J.S. Erickson, J. P. Golden, K. M. Jackson and F. S. Ligler, Biosens. Bioelectron., 2011, 26, 4263-4269.

H. Liu and R. M. Crooks, J. Am. Chem. Soc., 2011, 133, 17564-17566.

L. Ge, J. X. Yan, X. R. Song, M. Yan, S. G. Ge and J. H. Yu, Biomaterials, 2012, 33, 1024-1031.

G. G. Lewis, M. J. DiTucci, M. S. Baker and S. T. Phillips, Lab Chip, 2012, 12, 2630-2633.

H. Liu, Y. Xiang, Y. Lu and R. M. Crooks, Angew. Chem.—Int. Edit., 2012, 51, 6925-6928.

C. Renault, J. Kochne, A. J. Ricco and R. M. Crooks, Langmuir, 2014, 30, 7030-7036.

S. J. Vella, P. Beattie, R. Cademartiri, A. Laromaine, A. W. Martinez, S. T. Phillips, K. A. Miriea and G. M. Whitesides, Anal. Chem., 2012, 84, 2883-2891.

N. R. Pollock, J. P. Rolland, S. Kumar, P. D. Beattie, S. Jain, F. Noubary, V.L. Wong, R. A. Pohlmann, U. S. Ryan and G. M. Whitesides, Sci Transl. Med., 2012, 4, 10.

A. V. Govindarajan, S. Ramachandran, G. D. Vigil, P. Yager and K. F. Bohringer, Lab Chip, 2012, 174-181.

M. Reches, K. A. Mirica, R. Dasgupta, M. D. Dickey, M. J. Butte and G. M. Whitesides, ACS Appl. Mater. Interfaces, 2010, 2, 1722-1728.

X. Li, J. F. Tian and W. Shen, ACS Appl. Mater. Interfaces, 2010, 2, 1-6.

A. Nilghaz, D. H. B. Wicaksono, D. Gustiono, F. A. A. Majid, E. Supriyahto and M. R. A. Kadir, Lab Chip, 2012, 12, 209-218.

P. Bhandari, T. Narahari and D. Dendukuri, Lab Chip, 2014, 14, 4567-4674.

K. M. Schilling, A. L. Lepore, J. A. Kurian and A. W. Martinez, Anal. Chem., 2012, 84, 1579-1585.

E. da Silva, M. Santhiago, F. R. de Souza, W. K. T. Coltro and L. T. Kubota, Lab Chip, 2015, 15, 1651-1655.

E. M. Fenton, M. R. Mascarenas, G. P. Lopez and S. S. Sibbett, ACS Appl. Mater. Interfaces, 2009, 1, 124-129.

Merck Millipore, Rapid Lateral Flow Strips—considerations for product development, Millipore Corporation, Billerica, MA., Germany, 2013.

\* cited by examiner

FLUID FLOW DEVICE AND METHOD FOR MAKING THE SAME

BACKGROUND

The present invention relates to fluid flow devices, and methods of making such devices.

Devices configured to deliver a fluid sample from a first location on the device to a second location, for example a test location provided with a reagent, are well-known. One example of an application of such devices is in medical diagnostics, where a sample is deposited on the device for flow to a test location for reaction with a reagent that tests for a disease or other clinical condition or parameter. Often the result of the test is indicated by a colour change at the test location. The device takes the form of a substrate that defines at least one fluid flow path or channel between the deposition site and the test site.

These devices are of great interest because the role of diagnostics and point-of-care (POC) testing is highly beneficial for early clinical detection and subsequent intervention. POC testing provides an effective and rapid technique that excludes or minimises delay by providing a prompt exchange of vital information between the clinical care team and the patient, because the testing can be conducted at the point-of-care (which may be the patient's home, their general practitioner's clinic, or a hospital). The testing is facilitated through the use of uncomplicated, user-friendly and portable testing devices, and much effort has been directed towards producing diagnostic test-kits which are smaller, quicker and smarter, and importantly, cost-effective.

It has been recognised that microfluidic-based "lab-on-chip" (LOC) technology has considerable potential for medical diagnostics devices and systems [1]. Advantages of compact LOC devices include the use of smaller reagent volumes, faster reaction times and portability arising from the smaller device dimensions. These devices were originally developed on platform substrates such as silicon and glass using clean-room based fabrication processes adapted from the semiconductor processing industry. Polydimethylsiloxane (PDMS), a low-cost polymer, has also been considered but has various limitations; this has led to a search for other substrate materials, which now include paper, cotton, thermoplastics and photo-curable polymers. In particular, paper is now considered as a highly suitable substrate for the fabrication of LOC-type devices [2, 3]. As a substrate material, paper is inexpensive, abundantly available in a range of different engineered forms that exhibit different properties, can be stored and easily transported, and modified in terms of its liquid transport properties. Additionally, paper-based fabrication procedures themselves are relatively cheap. Paper is currently implemented for analytical and clinical chemistry, and tests are routinely performed for the detection of different chemical species. Two commonly known paper-based clinical tests are the pregnancy test and the lateral flow-based urine dipsticks that can simultaneously detect blood sugar, pH and ketone [4]. Clinical tests that can yield quantitative information of a multiplexed nature (i.e. can perform a series of parallel tests) using a single test strip are very attractive, and microfluidic paper-based analytical devices (pPADs) are an ideal platform for this. These paper-based microfluidic devices have one or more flow channels that are designed to guide and transport an analyte fluid from a point of entry on the device to a reaction zone that has been pre-treated with specific reagents. For paper-based devices the channels may be formed within and extend throughout the thickness of the paper. The walls that delineate the individual channels to contain and guide the flow of liquids may be made from impermeable materials integrated into the structure of the paper.

An early design for these microfluidic devices relied on a cleanroom-based lithographic technique of exposure of UV to a UV-sensitive polymer impregnated in a paper substrate through a custom-designed mask; this cross-linked the polymer to form the required pattern of fluid channels [5]. Lithography has also been proposed elsewhere [6, 7]. A development aimed at reducing costs arising from the lithographic procedure involved the use of a modified desktop plotter to dispense an ink composed of PDMS [8]. Other approaches include inkjet printer-based etching of paper impregnated with polystyrene [9], plasma-treatment through a metal mask of a paper impregnated with alkyl ketene dimer [10], paper-cutting using a computer-controlled X-Y knife plotter [11], printing of wax [12, 13], inkjet-printing [14, 15], flexographic printing [16], wax-screen printing [17], and laser-treatment of a paper with a hydrophobic coating [18]. Each of these techniques has its advantages and disadvantages. Lithography and plasma-treatment require expensive patterning masks or equipment and controlled laboratory conditions. The knife-plotting technique requires specialised or custom-modified patterning equipment, and other techniques may include undesirable post-processing procedures. Other issues are the limitation on achievable feature size resulting from lateral spreading of the material used to delineate channels (for example with wax printing), the need for specialised chemicals and inks (for ink-jet printing), and the use of harsh chemical etchants. Also, some of these techniques may harm the quality of the paper so that the paper's porosity or wicking ability is affected.

An alternative technique has been recently proposed by the present inventors [19]. This uses a light-writing technique to form walls or barriers to define fluid flow channels. The substrate, which may be paper, is impregnated with a radiation-sensitive material that is polymerisable when exposed to radiation, and hence can be selectively hardened (polymerised) by "writing" the required pattern of barriers over the substrate surface with a radiation beam to provide localised energy to transform or polymerise the light-sensitive material. A development step then removes any remaining non-hardened (un-polymerised) material using a solvent.

Three-dimensional (3D) fluid flow devices provide characteristics which are advantageous for certain applications. For example, a multi-layered 3D device may be formed of a stack of substrates (which may be of similar or dissimilar materials), permitting fluid flow in three dimensions, both laterally in the plane of a given substrate layer, and vertically through the thickness of the layers forming the composite. Such devices can for example allow a user to perform several assays within the same device footprint. Compared to a lateral (two-dimensional) flow device, such flow-through geometries provide flow paths that are comparatively shorter and therefore provide the capability for implementation of multiple-step assays via more compact device geometries. Additionally, such compact 3D devices can reduce the quantity of reagents that are either required or wasted, in comparison to 2D devices which typically require soaking of greater lengths and volumes of the porous substrates. Also, shorter flow paths enable reduced fluid distribution or delivery time leading to likely reductions in times for operation of such tests.

However, so far 3D fluid flow devices have been fabricated by the sequential assembly of individual layers of 2D devices, which then are joined layer-by-layer, e.g. using double-sided tape or with a hydrophilic spray adhesive, or by applying an outer adhesive, clamp or protective coating to pre-assembled layers to hold the layers in contact with each other. Another approach is based on the principle of origami, the traditional Japanese paper-folding art. In this approach, a 3D device is achieved by laying and folding a single piece of pre-patterned paper and then the stack is held together via a clamp. However, this method can cause issues of reproducibility as it relies on the individual performing the test following the instructions given and there is then the possibility of an incorrect procedure occurring, particularly if the person is performing the assembly for the first time.

SUMMARY

A first aspect of the present technique provides a method for making a fluid flow device, comprising:

providing a stack comprising a plurality of layers, wherein at least one of the layers is made of porous material and at least part of at least one layer is impregnated with a radiation-sensitive substance; and after providing the stack, applying radiation onto at least part of the stack to change the radiation-sensitive substance from a first state to a second state through at least part of the thickness of the stack.

Hence, radiation is applied onto at least part of a stack of layers, at least one of which is partially or wholly impregnated with a radiation-sensitive substance, to change the radiation-sensitive substance from a first state to a second state. In this way, structures for guiding the flow of fluid can be formed in the layers of the stack after the stack has already been formed, which has several advantages over forming the structures in a number of 2D layers individually before subsequently assembling and bonding the stack. Firstly, forming the structures after the stack has already been formed greatly reduces the difficulty in aligning the structures in different layers. Also, in addition to forming fluid flow structures, the change of state of the radiation-sensitive substance can also be useful for bonding the individual layers together, to reduce or avoid the need for other kinds of bonding, which helps to reduce manufacturing costs.

The first and second state of the radiation-sensitive substance may differ in various ways. In general, the state change may be any change of chemical or physical state which allows regions of greater permeability to fluid and regions of lower permeability to be formed in the fluid flow device (either through the application of the radiation alone, or through the application of the radiation in combination with a subsequent development step using a solvent). In some examples, the radiation-sensitive substance may be less permeable to fluid in one of the first state and second state than the other. In some examples, one of the first state and the second state may be a more solid state than the other state. In some examples, the radiation-sensitive substance may be less soluble to a developer in one of the first state and the second state than in the other, so that a subsequent development step can dissolve the parts of the substance that are in the more soluble state, leaving other parts in the less soluble state remaining. Some types of radiation-sensitive substance may exhibit a state change in response to radiation which has more than one of these properties (change in permeability, change in solubility and/or change between a solid and liquid state). In general, any of these state transition properties can be useful for forming structures for guiding or containing fluid flow in a fluid flow device.

The radiation may be applied to a surface layer at a surface of the stack, to change the radiation-sensitive substance from the first state to the second state in at least one layer other than the surface layer (the surface layer itself may also have radiation-sensitive substance changed in state). The surface layer may be the top or bottom layer of the stack. The inventors recognised that the applied radiation may propagate to interior layers of the stack, not just the surface layer. For example, where the applied radiation is electromagnetic radiation, the upper layers of the stack may be at least partially transparent to the radiation to allow the radiation-sensitive substance in an interior layer to change in state. This is very useful for fabricating multi-layer 3D fluid flow devices using a simpler fabrication method which does not require additional alignment or assembly steps.

The radiation may be applied to change the radiation-sensitive substance from the first state to the second state in aligned parts of at least two layers of the stack. For example, this allows walls, barriers or channels for guiding fluid flow to be formed in the corresponding parts of multiple layers of the stack simultaneously. Simply applying the radiation to a given area on the surface of the stack allows the radiation to penetrate through to multiple layers below, so that the formed structures are already aligned without any further alignment operations being required, greatly simplifying fabrication of 3D fluid flow devices compared to known methods.

By applying the radiation to change the radiation-sensitive substance from the first state to the second state in selected parts of the stack, a number of regions can be formed, intended to receive, contain, guide and/or control the flow of fluid during use of the device. For example, the regions may correspond to walls or barriers for blocking or inhibiting the flow of fluid, reservoirs for holding or containing fluid, channels for guiding the flow of fluid, or filters, partial barriers or other structures for regulating the rate of flow of the fluid. At least one of the formed regions may extend through at least two layers of the stack (e.g. a wall or barrier may extend through multiple layers to inhibit fluid flow at the corresponding positions of multiple layers, or a channel may extend through multiple layers to permit fluid flow between layers). Hence, the regions may form part of a three-dimensional fluid flow network comprising at least one fluid flow path for permitting fluid flow between different layers of the stack (the 3D network may in addition comprise at least one fluid flow path for permitting fluid flow within a given layer).

At least two of the stacked layers may be bonded together as a result of changing the radiation-sensitive substance from the first state to the second state in part of the stack. This can reduce manufacturing costs by allowing a single process to both form the fluid guiding structures and bond the layers together, avoiding the need for adhesives or other bonding techniques. For example, in addition to changing the state of the radiation-sensitive substance in certain regions for receiving, containing, guiding and/or controlling the flow of fluid, the state of the radiation-sensitive substance may also be changed at one or more sealing points of the stack which are remote from those regions (e.g. a number of sealing points distributed around the edge of the stack), to bond at least two layers together at the sealing points.

Various substances can be used as the radiation-sensitive substance. In one example, the radiation-sensitive substance may comprise metal particles which can be deposited on the substrate and then exposed to radiation (e.g. a laser, infrared radiation (heat) or an ion beam) to melt the metal, so that molten metal can spread through the porous material to form walls or barriers. The molten metal then solidifies to form a larger mass of metal than the original metal particles, so that the resolidified mass of metal is in a second state which is less permeable than the first state (the particulate state).

Other examples may use a polymerisable material as the radiation-sensitive substance, for which one of the first state and the second state is a more polymerised state (i.e. has a greater degree of polymerisation) than the other. The more polymerised state may be less permeable to fluid, more solid and/or less soluble to developer than the less polymerised state. In some cases, the second state may have a greater degree of polymerisation than the first state. A large number of substances are polymerisable; examples of suitable materials are described herein.

In one embodiment, the radiation-sensitive substance may comprise a photoresist, as defined and exemplified below.

In some examples, in the second state, the radiation-sensitive substance may be less permeable to fluid, more solid and/or less soluble to a developer than in the first state. For example, a negative photoresist may be used. With this approach, for example, the radiation-sensitive substance can be changed to the second state at the positions of desired walls or barriers for delineating the regions of the fluid flow device, to provide structures for containing the fluid.

In other examples, a type of radiation-sensitive substance may be used for which the second state is more permeable to fluid, less solid and/or more soluble to a developer than the first state. One example of such a substance may be a positive photoresist, for which the parts of the substance exposed to radiation may become more soluble to solvent, so that applying solvent in a subsequent developing step can remove the parts to which radiation has been applied and leave the remaining parts of the radiation-sensitive substance that are still in a less soluble state to form the walls or barriers or other structures for containing or guiding fluid.

In some examples, in one of the first state and second state, the radiation-sensitive substance may be impermeable to the fluid, so that structures formed from the radiation-sensitive substance in this state may contain fluid or block the flow of fluid.

In other examples, in one of the first state and the second state, the radiation-sensitive substance may still be partially permeable, but less permeable than in the other state. Structures formed in this state may be useful for slowing down the flow of fluid compared to the rate of flow through the porous substrate itself.

In some cases, at least one layer (or the entire stack) may be wholly impregnated with the radiation-sensitive substance. The impregnation of the radiation-sensitive substance may take place before or after forming the stack. In this case, the arrangement of fluid flow structures formed in the stack may depend on the properties of the radiation applied to the stack, rather than the pattern of impregnation of the radiation-sensitive substance.

However, it is also possible to selectively impregnate some regions of certain layers with the radiation-sensitive substance while leaving other layers unimpregnated. For example, the radiation-sensitive substance may be deposited onto a layer in a particular pattern, e.g. using an ink-jet printer, spray printing, a lithographic technique, or another deposition technique. The deposition could be applied in a certain pattern to the top layer of the stack with the radiation-sensitive substance then soaking through to layers below in a corresponding pattern. Alternatively, the layers may be separately impregnated with the radiation-sensitive substance in a given pattern, before assembling the stack. Hence, one or more of the layers may be partially impregnated with the radiation-sensitive substance in one or more selected parts of the layer. This approach allows the particular structures formed in the stack to be controlled not only by varying properties of the radiation, but also by varying the pattern in which the radiation-sensitive substance is deposited, which allows greater control over the nature of the fluid flow structures formed.

In some examples, all the regions for controlling fluid flow may be formed once the stack has already been assembled.

However, it is also possible for at least one of the layers of the stack to comprise at least one pre-formed region for receiving, containing, guiding or controlling the flow of fluid, which was formed prior to forming the stack. Further regions can then be formed after the stack has been assembled using the technique described above. This can allow more complex three-dimensional fluid flow networks to be fabricated.

In some examples, all the layers may be made from the same material (e.g. paper, nitrocellulose or another porous material).

However, it is also possible for the stack to include layers of different materials. For example, at least one isolation layer for blocking fluid flow from a neighbouring layer may be provided. The isolation layer may for example be formed of a hydrophobic material, such as polyvinylidene fluoride (PVDF). For example, the isolation layer may be provided between two neighbouring porous layers, to prevent fluid flowing between the neighbouring layers. This can be useful for reducing contamination between fluid flow channels in the respective neighbouring layers. Alternatively, the isolation layer may be an outer cladding layer on the surface of the stack, to encase a neighbouring layer to reduce loss of fluid at the surface of the neighbouring layer (as an unclad layer may lose fluid by evaporation for example, which could thereby lead to an increased viscosity of the fluid and hence an increased fluid transit time in the device). Even though the isolation layer may not be impregnated with any radiation-sensitive substance, the change of state of the radiation-sensitive substance in the neighbouring layer(s) may bond the neighbouring layer(s) to the isolation layer. In some cases, the isolation layer may include at least one hole for permitting fluid flow from at least one neighbouring layer, e.g. to allow for vertical fluid flow channels between the adjacent layers, or provide a fluid inlet via which fluid can be introduced to the stack from the surface.

After the radiation has been applied, a solvent (developer) may be applied to remove the radiation-sensitive substance which are in a more soluble state at certain areas of the stack. In the case of a radiation-sensitive substance which becomes less soluble on exposure to radiation, the solvent would remove the radiation-sensitive substance in regions of the stack which were not sufficiently exposed to radiation, while in the case of a substance which becomes more soluble on exposure to radiation, the solvent would remove the radiation-sensitive substance in the regions which were exposed to the radiation.

The radiation may be applied in different ways. For example, in some examples, radiation may be applied to the entire surface of the stack, and the shape and layout of fluid flow structures formed may be controlled based on the pattern in which the radiation-sensitive substance is deposited through the stack.

However, for more precise control of the formation of structures in the fluid flow device, other examples may apply radiation to at least one selected part of the stack, while preventing exposure of at least one other part of the stack to radiation. In some examples, this could be through the use of a mask for blocking the exposure of certain areas of the stack to radiation.

However, a particularly effective technique for localised application of radiation can be provided by exposing a beam of radiation onto the stack, and causing relative translation between the stack and the beam of radiation. The relative translation may be caused by moving either the stack or the beam of radiation, or both. In this way, the beam of radiation may move over parts of the deposited pattern of radiation-sensitive substance to selectively convert those parts of the substance to the second state. This allows the regions at which the radiation-sensitive substance is changed from the first state to the second state, and/or the depth (not only the number of layers affected, but also the depth within a certain layer) to which the radiation-sensitive substance is changed from the first state to the second state to be controlled precisely by varying at least one parameter of the beam. For example, at least one of the energy density or intensity of the beam, the width of the beam, a wavelength of the radiation (where the radiation is electromagnetic radiation), whether a continuous laser beam or pulsed laser beam is used (where the radiation comprises a laser beam), whether a controlled dose of radiation or exposure from the source is used, a speed of the relative translation between the stack and the beam, and a number of passes of the beam with respect to the stack, may be varied to allow precise control over the formation of the structures in the stacked layers.

The beam of radiation may be a beam of laser light. The light may be in the visible or ultraviolet region of the electromagnetic spectrum for example. Radiation sources other than lasers are not precluded, however.

The radiation-sensitive substance may be a polymerisable substance or a photoresist, for example.

Examples of suitable porous materials for the layers include paper and nitrocellulose. Other examples may include sintered materials such as sintered glass.

The method may further comprise depositing a biological or chemical reagent onto one or more regions on one or more layers of the stack. In some embodiments, the method comprises depositing the reagent before the exposing.

A second aspect is directed to a fluid flow device fabricated using the method of the first aspect.

A third aspect is directed to an apparatus configured to make a fluid flow device in accordance with the method of the first aspect.

A fourth aspect is directed to a method for making a fluid flow device, comprising:

providing a substrate of porous material, the substrate having a first surface and a second surface opposite the first surface;

applying a beam of radiation onto the first surface of the substrate and causing relative translation between the substrate and the beam, to change a state of a radiation-sensitive substance impregnated in at least part of the substrate; and applying a beam of radiation onto the second surface of the substrate and causing relative translation between the substrate and the beam, to change a state of a radiation-sensitive substance impregnated in at least part of the substrate.

Hence, a beam of radiation can be applied to both surfaces of a substrate of porous material at least partially impregnated with a radiation-sensitive substance to trigger a state change of the radiation-sensitive substance. The radiation-sensitive substance may be as discussed above, in particular it may be a substance which becomes more or less permeable, more or less solid, and/or more or less soluble to a developer when exposed to radiation. The radiation-sensitive substance could be the same at each surface. Alternatively, different types of radiation-sensitive substance could be impregnated at each surface, which may respond differently to the radiation. For example, one surface may be impregnated with radiation-sensitive substance which becomes more permeable, less solid or more soluble on exposure to radiation, while the other surface may be impregnated with a radiation-sensitive substance which becomes less permeable, more solid or less soluble on exposure to radiation.

In some cases, beams of radiation can be applied to both surfaces simultaneously. Alternatively, the beam may be applied to the first substance in a first pass and subsequently to the second surface in a second pass, so that an apparatus with only a single source of radiation can be used. Either way, this approach allows fluid flow control structures to be formed on both sides of the substrate, allowing a range of new types of fluid flow structures to be formed within a single layer of substrate. As the radiation can be controlled precisely to form structures extending partially through the thickness of the substrate, this allows independent patterning of each surface to create more complex fluid flow networks which is particularly useful for forming 3D devices.

For example, where each surface is impregnated with a radiation-sensitive substance which, when exposed to radiation, changes from a first state to a second state which is less permeable, more solid and/or less soluble to a developer than the first state, first and second cladding layers of radiation-sensitive substance in the second state may be formed extending from the first and second surfaces respectively through part of the thickness of the substrate. The cladding layers may extend across the entire plane of the substrate or partially across the plane of the substrate. A region of unimpregnated substrate material, or of substrate material impregnated with radiation-sensitive substance remaining in the first state (which can be removed with solvent subsequently), may remain between the cladding layers. This region effectively forms an enclosed fluid flow path which is embedded within the interior of the substrate, as opposed to being exposed at the surface of the substrate. A problem with known fluid flow devices which provide fluid channels at the surface of the substrate is that fluid can be lost at the surface due to evaporation, which can increase costs (the fluid may be an expensive reagent or valuable sample present in small volumes for example). Also surface paths can allow cross-contamination with fluid from outside, which can lead to false results or failed tests. These problems can be reduced by embedding the fluid flow path between cladding layers formed by applying beams of radiation from either side of the substrate.

In some cases, the first cladding layer or second cladding layer may include at least one inlet region of unimpregnated substrate material or substrate material where the radiation-sensitive substance remains in the first state, the inlet region extending into the thickness of the substrate. Hence, the cladding layers need not cover the entire area of the substrate, to allow for selected points at which fluid can be introduced into the substrate to enter the fluid flow network enclosed within the cladding. The inlet regions can be formed either by preventing the parts of the surface of the substrate which are to form the inlet regions being impregnated with radiation-sensitive substance, or by preventing those regions being exposed to the radiation.

Applying beams of radiation on both surfaces of a substrate can also be useful to allow regions for receiving, containing, guiding and/or controlling the flow of fluid to be formed at the first surface (using a radiation-sensitive substance in either the positive or negative regimes described below), while a backing layer of radiation-sensitive substance in the second state is formed on the second surface (using a radiation-sensitive substance at the second surface which becomes less permeable, more solid and/or less soluble on exposure to radiation). The backing layer may have a greater mechanical strength (e.g. greater mechanical stiffness, tear resistance and/or tensile strength) than the porous material of the substrate.

Isolation of the fluid flow network from the outside is often desirable to prevent contamination and loss of fluid as discussed above. Also, some substrate materials such as paper may be fragile (especially when wet). Therefore, with known devices often a backing support is bonded onto the surface of the substrate to provide additional mechanical support. However, with the method discussed above, the backing layer can effectively be formed inside the substrate itself, by converting the radiation-sensitive substance to the less permeable state at the second surface beneath the fluid flow network formed at the first surface. The backing layer may extend over a larger area than the structures formed at the first surface.

This approach avoids the need for additional manufacturing steps for applying the backing, enabling both the backing and the fluid flow network to be formed through a substantially common process. This is useful for reducing the cost of manufacturing. Another advantage of forming a backing layer inside the substrate is that this reduces the active volume of substrate that remains for the fluid flow network, and hence reduces the volume of reagent/sample required, not only reducing cost but also increasing the sample concentration as a given amount of sample now soaks through a reduced volume, hence improving limits of detection.

The backing layer may have a width wider than the width of the beam of radiation applied to the second surface. Hence, the backing layer may be formed by performing multiple passes of the beam relative to the substrate, with the beam being offset relative to the substrate between successive passes (either by moving the beam, or moving the substrate, or both). For example, in each pass, the beam may be applied onto the second surface of the substrate while causing relative translation between the substrate and the beam in a first direction parallel to the plane of the substrate, and between successive passes relative translation may be caused between the substrate and the beam in a second direction parallel to the plane of the substrate and perpendicular to the first direction. Hence, by writing across the second surface line-by-line with the beam, a backing layer may be formed over a two-dimensional expanse of the substrate surface. An advantage of forming the backing layer through multiple passes of a relatively narrow beam is that the same optics can be used to form the backing layer as are used to form the structures for forming the fluid flow network on the other surface of the substrate.

Alternatively, the backing layer may be formed using a beam of radiation focused by a cylindrical lens. A cylindrical lens focuses the beam along a line rather than to a point, so that a wider strip of substrate can be exposed to radiation in one pass. In this case, one pass of the beam may be enough to form the backing layer. On the other hand, multiple passes of the beam may still be used to provide a wider backing layer than the width of focus of the cylindrical lens, but the use of the cylindrical lens reduces the number of passes required compared to a circular or spherical lens providing a point focus.

In another example, regions for receiving, containing, guiding and/or controlling the flow of fluid may be formed at both the first surface and the second surface by applying beams of radiation. Hence, for example a first fluid flow network may be formed at the first surface and a second fluid flow network may be formed at the second surface, optionally with some channels permitting fluid flow between the first/second fluid flow networks. This approach allows more complex three-dimensional fluid flow networks to be formed. For this type of patterning, the radiation-sensitive substance may be either of the type where the second state is more permeable, less solid or more soluble than the first state, or the type were the second state is less permeable, more solid or less soluble than the first state, and again the radiation-sensitive substance used at the respective surfaces could be the same or different.

In all of the above examples, at least one parameter of the beam of radiation may be controlled to select the regions on the first surface or second surface at which the state of the radiation-sensitive substance is changed, and/or the depth to which the state of the radiation-sensitive substance is changed. As for the example, above, this could be by control of the beam's energy density, intensity, width or wavelength, or by control of the speed and hence exposure via the relative translation between the substrate and the beam or by the number of passes of the beam with respect to the substrate.

Fifth and sixth aspects provide a fluid flow device made by the method of the fourth aspect discussed above, and an apparatus configured to make a fluid flow device according to this method.

A seventh aspect provides a method for making a fluid flow device, comprising:

providing a substrate of porous material, where at least part of the substrate is impregnated with a radiation-sensitive substance in a first state; and applying radiation onto the substrate to change the radiation-sensitive substance from the first state to a second state, to form a backing layer of radiation-sensitive substance in the second state extending through part of the thickness of the substrate, wherein the substrate including the backing layer has greater mechanical strength than the porous material of the substrate.

Hence, a backing layer providing greater mechanical strength than the porous material of the substrate can be formed within the substrate by applying radiation onto the substrate, to selectively change a radiation-sensitive substance from a first state to a second state through part of the thickness of the substrate. Forming the backing layer in this way provides the advantages of reduced manufacturing cost, increased mechanical support, and reduced cost and improved sensitivity as mentioned above.

Again, in the second state, the radiation-sensitive substance may be less permeable to fluid, more solid and/or less soluble to a developer than in the first state.

The backing layer may have at least one of greater mechanical stiffness, greater tear resistance and greater tensile strength than the porous material of the substrate. Mechanical stiffness refers to the extent to which the material resists deformation in response to an applied force. In particular, the bending stiffness (e.g. the ratio between an applied bending force and the deflection caused) may be higher in the substrate containing the backing layer than in an equivalent thickness of bare substrate material. Tear resistance refers to the extent to which the material resists the formation or growth of cuts. Tear resistance (also known as tear strength) can be measured for example by known techniques such as ASTM D 412 or ASTM D 624. Tensile strength refers to the tensile stress (e.g. stretching force) a material can withstand before breaking, deforming or failing.

As discussed above, the backing layer may be formed using multiple passes of the beam relative to the substrate, using a beam focused by a cylindrical lens, or both.

In addition to forming the backing layer by applying radiation onto a first surface of the substrate, the method may also comprise applying radiation onto a second surface of the substrate opposite the first surface, to change a state of a radiation-sensitive substance through at least part of the thickness of the substrate extending from the second surface, to form one or more regions at the second surface intended to receive, contain, guide and/or control the flow of fluid during use of the device. The backing layer may extend over a larger area of the substrate than the regions formed at the second surface. Hence, fluid flow structures can be formed on one surface and the backing layer formed on the other surface, providing the advantages discussed above.

The depth of the backing layer may be controlled based on at least one parameter of the beam of the radiation. The parameter may be any of the parameters mentioned above (e.g. energy density or intensity, beam width, wavelength, exposure, or speed or relative translation or number of passes).

The method discussed above forms a backing layer within a substrate. For some fluid flow devices, the substrate layer in which the backing layer is formed may be the only layer of substrate provided. However, the method can also be used with a stack of substrate layers as discussed above. In this case, the backing layer may for example be formed within the bottom layer of the stack of substrates. Hence, the method permits other layers of substrate to be stacked on top of the layer in which the backing layer is formed.

Eighth and ninth aspects provide a fluid flow device made by the method of the seventh aspect discussed above, and an apparatus configured to make a fluid flow device according to this method.

Further aspects, features and advantages of the present technique will be apparent from the following description of examples, which is to be read in conjunction with the accompanying drawings.

DETAILED DESCRIPTION OF EXAMPLES

Figure 1:
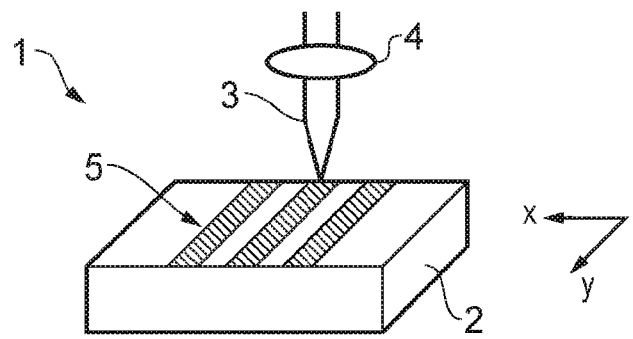
FIG. 1 shows a simplified schematic perspective view of a system for performing part of a method according to embodiments of the invention.

Some specific examples will be described below. It will be appreciated that the invention is not limited to these particular examples.

Definitions

"Radiation" herein refers to any form of radiative energy, including energy transferred by waves or particles. Examples include electromagnetic radiation (including any part of the electromagnetic spectrum, e.g. radiofrequency radiation, microwaves, visible light, infrared radiation, ultraviolet radiation, X-ray radiation, gamma radiation etc.); radiation of particles (e.g. electron beam, ion beam, etc.), or acoustic radiation (e.g. ultrasound).

"Radiation-sensitive substance" refers to any substance or combination of multiple substances which, when radiation is applied thereto, changes from a first state to a second state. In some embodiments, the substance is less permeable, more solid, and/or less soluble to a developer in one of the first state and the second state than the other. In some embodiments, the radiation-sensitive substance comprises one or more polymerisable substances, as described herein.

"Wall" refers to a structure of the fluid flow device that extends substantially through (e.g. completely through) the thickness of at least one layer of substrate and is impermeable to the fluid for which the device is intended to be used.

"Barrier" refers to a structure of the fluid flow device which is less permeable than other parts of the substrate, but which is not completely impermeable to the fluid for which the device is intended to be used. The barrier may be partially permeable because the barrier does not extend through the entire thickness of a layer of substrate, or because the substance forming the barrier is partially permeable, or both.

"Depositing" refers to depositing of the radiation-sensitive substance on the substrate.

"The application of radiation" refers to the application of radiation to at least part of the substrate, such that at least part of the substrate is exposed to radiation.

The following description describes a technique suitable for defining fluid-containing regions such as flow channels, wells and reservoirs in a substrate or membrane made from porous material, such as paper, nitrocellulose or sintered glass. The regions are defined by barriers or walls within the substrate at the boundaries of each region, such as at each side of a channel. The walls are formed from a less permeable state of a radiation-sensitive substance, for which a state change is induced by exposure to radiation energy.

Radiation-Sensitive Substances

The method of the present technique uses radiation to create regions of less permeable material (e.g. the walls or barriers of fluid-containing regions) within areas of porous material (e.g. the inside of the channels, reservoirs and similar, plus areas outside the fluid-containing regions) in a porous substrate such as paper or nitrocellulose. To achieve this, a radiation-sensitive substance is used which can be altered or changed from a first state to a second state by the application of radiation. One of the first state and the second state is a less permeable, more solid or less soluble state. In some cases that one of the first/second states may be an impermeable state, in which the substance takes the form of a material that impedes flow of fluid and can therefore be used to create a physical wall or barrier to fluid flow within the material of the substrate. The less permeable state may in some examples be hydrophobic, as this helps in containing larger volumes of aqueous fluids within the flow channel structure for longer times. However, radiation-sensitive substances having a less permeable state which is not hydrophobic can also be used, and may provide adequate fluid containment. The other more permeable state is typically a liquid state so that the radiation-sensitive substance can be conveniently applied to the substrate in a pattern corresponding to the desired locations of the walls or barriers. For example, the substance is deposited onto the substrate surface in the required pattern and then permeates or soaks into the substrate below the pattern so that a volume of material extending through the thickness of the substrate becomes impregnated with the radiation sensitive substance.

Any radiation-sensitive substance, compound, chemical or material which behaves in this way and which can be impregnated into the substrate material (either impregnated throughout the substrate, or selectively in a desired pattern) can be employed in the present invention.

In some examples, the radiation-sensitive substance is transformed by radiation exposure from a first state to a second state which is less permeable, more solid and/or less soluble to developer, and hence can be considered to operate in a negative regime. In the case of a less permeable state, it may be a partially permeable state or a fully impermeable state. In some examples, the less permeable state may also be seen as a solid state or a state in which the substance is insoluble to a developer.

In other examples, the radiation-sensitive substance may operate in an opposite, positive regime, in which exposure to radiation transforms the substance from a first state to a second state which is more permeable to fluid, less solid and/or more soluble to developer. With this approach, the substance can be laid down in areas of the substrate corresponding to both the walls/barriers and the fluid containing regions within the walls/barriers. Radiation may then be applied locally to the fluid-containing regions but not the walls/barriers to selectively convert the fluid containing regions to the more permeable, less solid or more soluble state (e.g. a liquid state). A subsequent development step may then use solvent to remove the radiation-sensitive substance that is in the first state, but not the walls/barriers corresponding to substance in the second state.

Use of a negative-type radiation-sensitive substance may often be more convenient (it may require less radiation-sensitive substance to be deposited and less removal of excess radiation-sensitive substance using a solvent or other developer), and for the subsequent description a negative-type substance will be described. However, it will be appreciated that positive-type substances could also be used.

For a negative-type radiation-sensitive substance, exposure of the substance to radiation forms less permeable, more solid and/or less soluble material within the substrate in the exposed areas. Hence, if the radiation is applied in the form of a beam which is moved to follow lines of the deposited pattern, the substance is hardened along the lines so as to become walls or barriers for fluid-containing regions. The width of the beam can be chosen relative to the width of lines in the pattern to be narrower, the same or wider, and aligned exactly or with an overlap, so as to expose all or only some of the substance. Various effects can thereby be achieved; these are described in more detail later.

Radiation-sensitive substances suitable for use in the invention include materials sometimes referred to as polymerisable substances, photoresists, and radiation-curable resins and adhesives, inks and other similar materials.

Typically, the polymerisable substance is a substance containing molecules (monomers) which, on the application of radiation, bond to one another to form a polymer. The polymer may be more permeable or less permeable than the polymerisable substances from which it is formed. Typically, the polymer is less permeable than the polymerisable substances from which it is formed. In some examples, the more permeable state may be a liquid state and the less permeable state may be a state which is more solid, firm or hard. In some examples, the polymer may be more or less soluble to a developer than the polymerisable substances from which it is formed.

The polymerisable substance may comprise (or consist of) a monomer molecule. In this specification the term "monomer molecule" means a molecule capable of undergoing polymerisation to thereby form the constitutional units of a polymer.

The polymer formed from the monomer molecules is typically an organic polymer. A large number of organic polymers are known in the art. Examples of particular classes of organic polymers suitable for use according to the present invention include polyolefins, polyesters, polycarbonates, polyamides, polyimides, polyether sulfones, and mixtures or derivatives thereof.

In the technique of the present invention, the monomer molecule is typically capable of radiation-initiated polymerisation (i.e. polymerisation initiated by the application of radiation, as defined herein). Examples of such monomer molecules include ethylenically unsaturated monomers. Any compound having a carbon-carbon double bond and which is capable of being polymerised by the application of radiation may function as an ethylenically unsaturated monomer.

In one embodiment, the ethylenically unsaturated monomer may be an olefin: in other words, an unsubstituted, unsaturated hydrocarbon (such as ethylene, propylene, 1-butene, 1-hexene, 4-methyl-1-pentene or styrene). In this specification polymers formed by polymerising such monomers are termed 'polyolefins'.

In another embodiment, the ethylenically unsaturated monomer is an ethylenically unsaturated hydrocarbon substituted with one or more functional groups; examples of such functional groups include the substituents defined and exemplified below in relation to the substituent group $R_2$ on an acrylate or methacrylate group; further examples include halogen atoms, particularly fluorine atoms (examples of olefins substituted with such groups include vinylidene fluoride or tetrafluoroethylene) or chlorine atoms (examples of olefins substituted with such groups include vinyl chloride and vinylidene dichloride), carboxylic acid or carboxylic ester groups (examples of olefins substituted with such groups include acrylic or methacrylic monomers, as described and exemplified below), nitrile groups (examples of olefins substituted with such groups include acrylonitrile and methacrylonitrile). In this specification polymers formed by polymerising such monomers are termed 'substituted polyolefins'.

In one embodiment, the ethylenically unsaturated monomer is a (meth)acrylate monomer. These are monomers of the formula:

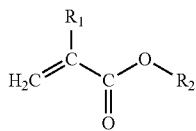

wherein $R_1$ is hydrogen or methyl, and $R_2$ is hydrogen or a substituent, or two groups $R_2$ together form a linker group. When $R_1$ is hydrogen, the monomer is an acrylate monomer. When $R_1$ is methyl, the monomer is a methacrylate monomer.

When $R_2$ is a substituent, the substituent may comprise or consist of a hydrocarbyl group, typical examples of which include alkyl, alkenyl, alkynyl, cycloalkyl, heterocyclyl, aryl and heteroaryl groups. In one embodiment the substituent may comprise or consist of an alkyl group. In this specification the term "alkyl group" means a saturated, monovalent, hydrocarbon moiety. The alkyl group is typically a $C_{1-30}$ alkyl group, such as a $C_{1-10}$ alkyl group, such as a $C_{1-6}$ alkyl group, such as a $C_{1-4}$ alkyl group, such as a methyl, ethyl, n-propyl, isopropyl, n-butyl, isobutyl, sec-butyl, or tert-butyl. The alkyl group may be substituted with one or more (typically only one) substituent, examples of which include halogen (especially fluorine or chlorine), hydroxy, nitrile (—CN), carboxylic acid (—CO$_2$H) and carboxylic ester (—CO$_2$R') where R' is hydrogen or a substituent, typically a $C_{1-6}$ alkyl group or a benzyl group.

In one embodiment the substituent may comprise or consist of an alkenyl group. In this specification the term "alkenyl group" means a monovalent, hydrocarbon moiety having at least one carbon-carbon double bond. The alkenyl group is typically a $C_{2-10}$ alkenyl group, such as a $C_{2-6}$ alkenyl group. The alkenyl group may be substituted with one or more (typically only one) substituent, examples of which include halogen (especially fluorine or chlorine), hydroxy, nitrile (—CN), carboxylic acid (—CO$_2$H) and carboxylic ester (—CO$_2$R') where R' is hydrogen or a substituent, typically a $C_{1-6}$ alkyl group or a benzyl group.

In one embodiment the substituent may comprise or consist of an alkynyl group. In this specification the term "alkynyl group" means a monovalent, hydrocarbon moiety having at least one carbon-carbon triple bond. The alkynyl group is typically a $C_{2-10}$ alkynyl group, such as a $C_{2-6}$ alkynyl group. The alkenyl group may be substituted with one or more (typically only one) substituent, examples of which include halogen (especially fluorine or chlorine), hydroxy, nitrile (—CN), carboxylic acid (—CO$_2$H) and carboxylic ester (—CO$_2$R') where R' is hydrogen or a substituent, typically a $C_{1-6}$ alkyl group or a benzyl group.

In one embodiment the substituent comprises or consists of a cycloalkyl group. In this specification the term "cycloalkyl group" means a monovalent, saturated, cyclic hydrocarbon group. The cycloalkyl group is typically a $C_{3-10}$ cycloalkyl group, such as a $C_{3-8}$ cycloalkyl group, such as a $C_{4-6}$ cycloalkyl group. The cycloalkyl group may be substituted with one or more (typically only one) substituent, examples of which include halogen (especially fluorine or chlorine), hydroxy, nitrile (—CN), carboxylic acid (—CO$_2$H) and carboxylic ester (—CO$_2$R) where R is hydrogen or a substituent, typically a $C_{1-6}$ alkyl group or a benzyl group.

In one embodiment the substituent comprises or consists of a heterocyclyl group. In this specification the term "heterocyclyl group" means a monovalent, saturated, cyclic group, having 1 to 4 heteroatoms selected from nitrogen, oxygen and sulphur. The heterocyclyl group is typically a 5- or 6-membered heteroaryl group, such as a tetrahydrofuryl, pyrrolidinyl, tetrahydrothienyl, oxazolidinyl, isoxazolidinyl, thiazolidinyl, isothiazolidinyl, thiadiazolidnyl, piperidinyl, piperazinyl or morpholinyl group. The heterocyclyl group may be substituted with one or more substituent, examples of which include halogen (especially fluorine or chlorine), hydroxy, nitrile (—CN), carboxylic acid (—CO$_2$H) and carboxylic ester (—CO$_2$R) where R is hydrogen or a substituent, typically a $C_{1-6}$ alkyl group or a benzyl group.

In one embodiment the substituent comprises or consists of an aryl group. In this specification the term "aryl group" means a monovalent, unsaturated, aromatic group (i.e. an unsaturated group having 4n+2 pi electrons, where n is an integer, preferably 1 or 2). The aryl group is typically a $C_{6-10}$ aryl group, such as a phenyl or naphthyl group. The aryl group may be substituted with one or more substituent, examples of which include halogen (especially fluorine or chlorine), hydroxy, nitrile (—CN), carboxylic acid (—CO$_2$H) and carboxylic ester (—CO$_2$R) where R is hydrogen or a substituent, typically a $C_{1-6}$ alkyl group or a benzyl group.

In one embodiment the substituent comprises or consists of a heteroaryl group. In this specification the term "heteroaryl group" means a monovalent, unsaturated, aromatic group, having 1 to 4 heteroatoms selected from nitrogen, oxygen and sulphur. The heteroaryl group is typically a 5- or 6-membered heteroaryl group, such as a furyl, pyrrolyl, thienyl, oxazolyl, isoxazolyl, thiazolyl, isothiazolyl, triazolyl, thiadiazolyl, tetrazolyl, pyridiyl, pyrimidyl, pyrazinyl or triazinyl group. The heteroaryl group may be substituted with one or more substituent, examples of which include halogen (especially fluorine or chlorine), hydroxy, nitrile (—CN), carboxylic acid (—CO$_2$H) and carboxylic ester (—CO$_2$R) where R is hydrogen or a substituent, typically a $C_{1-6}$ alkyl group or a benzyl group.

Examples of acrylate and methacrylate monomers include acrylic acid ($R_1$ and $R_2$ are H) methacrylic acid ($R_1$ is methyl and $R_2$ is H), and acrylic and methacrylic esters such as methyl acrylate ($R_1$ is H and $R_2$ is methyl), ethyl acrylate ($R_1$ is H and $R_2$ is ethyl), 2-ethylhexyl acrylate ($R_1$ is H and $R_2$ is 2-ethylhexyl), hydroxyethyl methacrylate ($R_1$ is H and $R_2$ is 2-hydroxyethyl), butyl acrylate ($R_1$ is H and $R_2$ is butyl) and butyl methacrylate ($R_1$ is methyl and $R_2$ is butyl).

When two groups $R_2$ together form a linker group, the monomer is a diacrylate or dimethacrylate. The linker group may be an aliphatic chain (for example an alkylene group or an oxyalkylene group), an alicyclic linker ring (for example a cycloalkylene, arylene or heteroarylene ring), or a combination thereof.

In one embodiment the linker group comprises or consists of an alkylene group. In this specification the term "alkylene group" when used to define the linker group means an aliphatic, saturated, divalent, hydrocarbon moiety. The alkylene group is typically a $C_{1-30}$ alkylene group, such as a $C_{1-10}$ alkylene group, such as a $C_{1-6}$ alkylene group, such as a $C_{1-4}$ alkylene group, such as a methylene, ethylene, methylmethylene, propylene or butylene group, and especially an ethylene group. The alkylene group may be substituted with one or more (typically only one) substituent, examples of which include halogen (especially fluorine or chlorine), hydroxy, nitrile (—CN), carboxylic acid (—CO$_2$H) and carboxylic ester (—CO$_2$R) where R is hydrogen or a substituent, typically a C$_{1-6}$ alkyl group or a benzyl group. In one embodiment, the substituent on the alkylene group links the alkylene group to the rest of the linker group, such as those defined and exemplified below.

In one embodiment the linker group comprises or consists of a cycloalkylene group. In this specification the term "cycloalkylene group" when used to define the linker group means a divalent, saturated hydrocarbon group. The cycloalkylene group is typically a C$_{3-10}$ cycloalkylene group, such as a C$_{3-8}$ cycloalkylene group, such as a C$_{4-6}$ cycloalkylene group. The cycloalkylene group may be substituted with one or more (typically only one) substituent, examples of which include halogen (especially fluorine or chlorine), hydroxy, nitrile (—CN), carboxylic acid (—CO$_2$H) and carboxylic ester (—CO$_2$R) where R is hydrogen or a substituent, typically a C$_{1-6}$ alkyl group or a benzyl group. In one embodiment, the substituent on the cycloalkylene group links the cycloalkylene group to the rest of the linker group, such as those defined and exemplified below.

In one embodiment the linker group comprises or consists of an arylene group. In this specification the term "arylene group" when used to define the linker group means a divalent, unsaturated, aromatic group. The arylene group is typically a C$_{6-10}$ arylene group, such as a phenylene group or naphthylene group. The arylene group may be substituted with one or more substituent, examples of which include halogen (especially fluorine or chlorine), hydroxy, nitrile (—CN), carboxylic acid (—CO$_2$H) and carboxylic ester (—CO$_2$R) where R is hydrogen or a substituent, typically a C$_{1-6}$ alkyl group or a benzyl group. In one embodiment, the substituent on the arylene group links the arylene group to the rest of the linker group, such as those defined and exemplified below.

In another embodiment the linker comprises or consists of an oxyalkylene or polyoxyalkylene group. An oxyalkylene group has the formula:

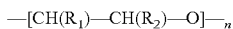

wherein R$_1$ and R$_2$ are hydrogen or a C$_{1-4}$ alkyl group, such as a methyl group, and n is typically 1 to 350, such as 1 to 100, such as 1 to 50, such as 1 to 20, such as 1, 2, 3, 4, 5, 6, 7, 8, 9, or 10. When n is 1, the linker comprises an oxyalkylene group: when n is 2 or more, the linker comprises a polyoxyalkylene group. Typically the linker group is a oxyethylene or polyoxyethylene group (i.e. wherein R$_1$ and R$_2$ are hydrogen).

In another embodiment the linker comprises or consists of an ester (—C(=O)—O—) group. In another embodiment the linker comprises or consists of an amide (—C(=O)—N(R")—) group, where R" is hydrogen or a substituent, typically a C$_{1-6}$ alkyl group or a benzyl group. In another embodiment the linker comprises or consists of an ether (—O—) group.
In one embodiment, the linker comprises or consists of a urethane (—O—C(=O)—NR"—) group (where R" is as defined above).

In one embodiment, the linker group comprises both an alkylene group (as defined and exemplified above) and an oxyalkylene or polyoxyalkylene group (as defined above). The linker group may comprise an oxyalkylene or polyoxyalkylene group having two alkylene termini. In this embodiment, the oxyalkylene or polyoxyalkylene group may be bonded directly to the two alkylene termini or may be bonded via a linker group, typically an ester group.

In one embodiment, the linker group comprises both an alkylene group, cycloalkylene group and/or an arylene group (as defined and exemplified above) and one or more urethane groups (as defined above). In one embodiment, the linker group may be an alkylene, cycloalkylene group/or an arylene group having two urethane termini. In this embodiment, the alkylene, cycloalkylene group/or an arylene group may be bonded directly to the two urethane termini or may be bonded via a further linker group, such as those defined and exemplified above.

Examples of such diacrylates and dimethacrylates include alkylene diacrylate or dimethacrylates (where two groups R$_2$ together form alkylene, as defined and exemplified above, especially ethylene glycol diacrylate or dimethacrylate) and glycol ether diacrylates and dimethacrylates, such as polyalkylene glycol diacrylates and polyalkylene glycol dimethacrylates, where two groups R$_2$ together form an oxyalkylene or polyoxyalkylene group, as defined and exemplified above) polyethylene glycol dimethacrylate. The polyethylene glycol moiety of polyethylene glycol diacrylates and polyethylene glycol dimethacrylates typically has an average molecular weight ranging from 200 to 20,000, typically 200 to 1000.

Further examples of such diacrylates and dimethacrylates include urethane diacrylates or dimethacrylates (where two groups R$_2$ together form a linker including a urethane linkage, as defined and exemplified above). A particular example is the urethane di(meth)acrylate sold as OP-66-LS by DYMAX Corporation.

Further examples of acrylates include the acrylate monomer sold as ABELUX A4061T by DYMAX Corporation.

In another embodiment, the monomer is a mercapto ester. As is known to the person skilled in the art, mercapto esters have the formula R—C(=O)—SR' wherein R and R' are substituents, as defined above in relation to the substituents R$_2$ on an acrylate or methacrylate group, especially, alkyl, aryl or heteroaryl groups. These may be copolymerised with a number of other co-monomers, such as triallyl isocyanurate (CAS No. 1025-15-6) or tetrahydro-2-furanylmethyl methacrylate. Examples of co-monomer mixtures include those sold as Norland 61 and Norland 68 by Norland Products Incorporated.

The polymer formed from the monomers may be cross-linked. Typically, a cross-link is a region in the polymer from which at least four chains emanate, and is typically formed by reactions involving sites or groups on the existing polymer structure or by interactions between existing polymers. The region may be a direct bond between the polymer chains, a single atom (such as an oxygen or sulphur atom), a group of atoms (such as an alkylene group or alkyleneoxy group, as defined and exemplified above), or a number of branch points connected by bonds, groups of atoms, or oligomeric chains.

Cross-linking of the polymer chains can result in a network polymer. The degree of cross-linking of a network polymer may vary depending on the nature of the polymer and the conditions and reagents used to produce it. Examples of suitable reagents and conditions are well known to those skilled in the art. The degree of cross-linking can influence the mechanical strength of the polymer and the degree of permeability to a fluid.

The polymerisable substance may be polymerised by any method known to those skilled in the art. Examples of polymerisation methods include radical polymerisation (in which the reactive species which carry the polymerisation chain reaction are free radicals), cationic polymerisation (in which the reactive species which carry the polymerisation chain reaction are cations), anionic polymerisation (in which the reactive species which carry the polymerisation chain reaction are anions), or any combination thereof. It is preferred that the polymerisation method is radical polymerisation, as this mechanism is most easily induced by radiation.

In one embodiment, the monomer is polymerised in the presence of a photoinitiator. A photoinitiator is a chemical compound that decomposes into free radicals when radiation is applied. The photoinitiator may be a Type I or Type II photoinitiator. Type I photoinitiators undergo cleavage upon irradiation to generate two free radicals in which only one is reactive and proceeds to initiate polymerization. Type II photoinitiators form an excited state (e.g. a triplet state) upon irradiation but must abstract an atom or electron from a donor synergist, which then acts as the initiator for polymerization.

Examples of photoinitiators are well known to those skilled in the art. Examples of Type I photoinitiators include azobis(isobutyronitrile) (AIBN), peroxides such as benzoyl peroxide, benzoin ethers, benzil ketals, α-dialkoxyacetophenones, α-aminoalkylphenones, α-hydroxyacetophenones, and acyl phosphine oxides. Examples of Type II photoinitiators include diaryl ketones (benzophenones) such as benzophenone and substituted benzophenones, thioxanthones such as isopropyl thioxanthone and 2,4-diethylthioxanthone, and quinones such as benzoquinone, camphorquinone and anthraquinone.

In one embodiment, the radiation sensitive material comprises (or consists of) a photoresist. Photoresists are classified into two groups: positive resists and negative resists. In the context of the present technique, the term "positive resist" means a type of photoresist in which the portion of the photoresist that is exposed to radiation becomes more soluble to the developer (e.g. a solvent). The portion of the positive photoresist that is unexposed remains less soluble. For example, exposure to the radiation changes the chemical structure of the resist so that it becomes more soluble in the developer, and the exposed resist can be washed away by the developer solution, leaving windows of bare underlying material.

In contrast, in the context of the present technique, the term "negative resist" means a type of photoresist in which the portion of the photoresist that is exposed to radiation becomes less soluble to a developer. For example, when exposed to radiation, the negative resist becomes cross-linked/polymerised and more difficult to dissolve in the developer. The negative resist remains in the regions where it is exposed to radiation, and the developer solution removes the unexposed areas (although masks are not essential for the present technique, the term "negative" is derived from the fact that a mask used for negative resists contains the inverse or photographic 'negative' of the pattern to be transferred). In one embodiment, the photoresist is a negative photoresist.

The invention is not limited to any particular radiation-sensitive substance. Radiation-sensitive or photosensitive materials other than those described above but which nevertheless behave in a similar manner may be used to implement the various embodiments of the invention. The type of radiation (e.g. wavelength of electromagnetic radiation) and the level of energy density needed will depend on the choice of radiation-sensitive substance and the thickness and structure of the substrate. Various radiation-sensitive substances may require more than one form of radiation exposure, e.g. a heat treatment after a light exposure stage to harden or produce the required properties; methods according to various embodiments of the invention may include such a step if necessary.

As examples of radiation-sensitive substances, the inventors have used the polymerisable substances DeSolite (registered trade mark) 3471-3-14 (from DSM Desotech Inc. or Chemtrec International, USA), in which the monomer is a glycol ether acrylate, and SUBSTANCE G (from Maker-Juice, USA), in which the monomer is an acrylate ester, to implement embodiments of the invention. As mentioned, however, other radiation-sensitive substances with the appropriate characteristics could be used.

In some examples, two or more different types of radiation-sensitive substances may be deposited on the substrate. For example, a first type of radiation-sensitive substance may be deposited in a first pattern and a second type of radiation-sensitive substance may be deposited in a second pattern. The different types of radiation-sensitive substance may have different properties, e.g. different permeability, different energy density (energy per unit area) of radiation required for converting the state of the substance, etc. This can allow for further control of the generation of substances in the fluid flow network, e.g. with a single source of radiation having a set energy density, structures of differing permeability can be created using the two or more different types of radiation-sensitive substance.

Fluid Flow Channel Formation

Information regarding a light-writing technique used to create fluid flow channels by creating walls extending through the full thickness of a paper substrate has been previously presented [19]. In this technique, the substrate is completely impregnated with a light-sensitive substance by soaking the substrate in the substance, and a light beam is moved over the substrate to selectively harden the substance in the exposed areas only. After exposure, the substrate is subjected to a development stage in which a solvent is used to remove non-hardened light-sensitive substance which has not been exposed to the light. Hence, it is the relative motion between the light beam and the substrate which defines the pattern of solid material and hence the channel structure.

FIG. 1 shows a highly simplified schematic representation of a system 1 for performing a light-writing technique. A planar substrate 2 of paper impregnated with a light-sensitive substance in the form of a photopolymer is provided. A laser (not shown) delivers a light beam 3 which is focused using one or more mirrors or lenses 4 and directed onto the surface of the substrate 2. Relative translation in the X and Y directions (in the plane of the substrate) between the substrate surface and the light beam is used to trace or write a pattern of lines on the substrate 2. The light delivers energy into the substrate and acts to cross-link/polymerise the photopolymer (changing it from its first state into its second state) below the sites or areas (the written lines) of light exposure, which creates a series of solidified polymer lines (walls or barriers) within the substrate. In this example, a set of three parallel lines 5 has been written.

Figure 2:
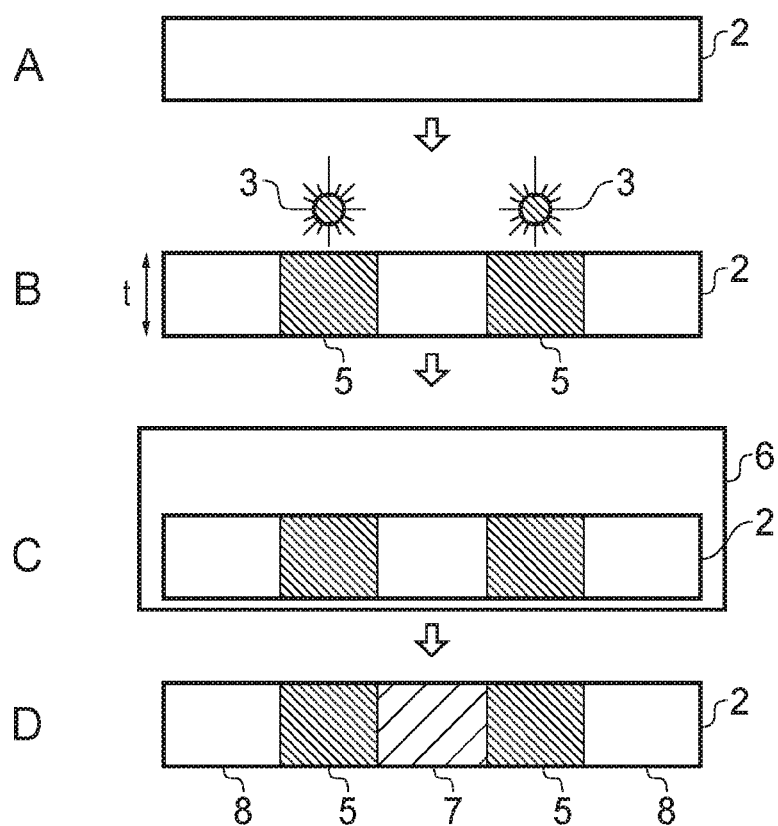
FIG. 2 shows a schematic illustration of forming fluid flow structures by applying radiation to convert a radiation-sensitive substance from a first state to a second state.

FIG. 2 shows a schematic illustration of various steps in this process, as side views of the substrate. In step A (impregnation), the porous substrate 2 is impregnated with the light-sensitive curable photopolymer (also variously called resist, resin or adhesive), by soaking it in a solution of the photopolymer. In step B (exposure), the focused light beam 3 is scanned directly over the surface of the substrate 2 to write the required pattern of lines, in this example two lines. Under each line, a volume of the substrate which has been exposed to a sufficient amount of light energy experiences polymerisation of the photopolymer as it is changed from the first, liquid, state to the second, solid (and in this example, also hydrophobic), state so that two walls of solid polymer 5 are formed. The walls extend through the thickness t of the substrate, from the top surface to the bottom surface. In step C (development), the substrate 2 is developed by immersion in a solvent 6 which acts to remove the unpolymerised substance (those volumes of photopolymer still in the first state) from the substrate 2, leaving the plain, untreated and hence hydrophilic substrate material in those parts of the substrate that have not been exposed to the light beam. Step D shows the finished substrate (which may be a finished device, or may require further manufacturing steps to produce the device). The two solid walls 5 form boundaries for a region of the substrate between the walls 7 which has not been polymerised so now comprises plain substrate material, and which is hence the fluid flow channel 7 since the walls 5 will act to confine fluid introduced into that region so that it flows along the channel by wicking. On the other sides of the walls 5, the substrate is also plain untreated substrate material 8.

Although FIG. 2 shows an example where the radiation-sensitive substance is polymerised through the entire thickness of the substrate, it is also possible to control the properties of the laser beam (e.g. the speed of relative translation between the substrate and the beam, or the energy density or fluence of the beam) so that the substance is converted to the second state through only part of the thickness of the substrate. It is also possible to form a semi-permeable barrier that extends all the way through the porous substrate. The partially-permeable barrier can be formed, for example, by applying lower energy so that the substance is not completely polymerised, forming a wall or barrier of more polymerised material with some "holes" of less polymerised material which can be removed with a solvent. This can be useful for forming structures for controlling the rate at which fluid flows through the substrate, or for filtering particles within the fluid. Further information concerning the formation of partial barriers can be found in references [19] and [22].

In the example of FIG. 2, the substrate is completely impregnated with the radiation-sensitive substance. However, it is also possible to deposit the radiation-sensitive substance in certain patterns, e.g. patterns of walls or barriers, before applying the radiation to the substrate; in one embodiment, the substrate may be exposed in general to radiation; in another embodiment, a radiation beam may follow the same pattern. Hence, the pattern of walls and barriers may be defined at least in part by the deposition of the substance, rather than the application of radiation. One advantage is that areas of the substrate which are not deposited with the substance retain the inherent properties of the substrate, such as the porosity or natural wicking ability of the substrate. Also, less radiation-sensitive substance is needed, and there is less excess substance to be removed in a development stage. In some examples, the development stage may be eliminated entirely since all the radiation-sensitive substance can be converted to a less permeable state, which is both more efficient, and avoids problems associated with residual radiation-sensitive substance remaining in the substrate. In other examples, there may still be some excess radiation-sensitive substance in the more permeable state, for instance following deposition the radiation-sensitive substance may have spread outwards while soaking through the substrate, so that there is some substance beyond the location of the deposited surface pattern, and depending on the width and positioning of the beam of radiation used this may lead to some parts of the substance not being converted into the less permeable state, in which case some development may still be required. Nevertheless, the amount of excess radiation-sensitive substance to be removed can be greatly reduced. Further information concerning the selective deposition of radiation-sensitive substance in certain areas of the substrate can be found in [23].

Three-Dimensional Fluid Flow Devices

The examples below discuss methods suitable for constructing three-dimensional (3D) fluid flow devices. Compared with a conventional 2D geometry, 3D devices provide a number of unique characteristics which are advantageous for certain applications. As an example, in the case of a multi-layered 3D device, which is a stack of substrates that can be of similar or dissimilar materials, fluid-flow can be in all three dimensions, i.e. both laterally in the plane of any substrate layer, and vertically through the thickness of any or all layers that form the composite, and such devices would thus enable a user to perform several assays within the same device footprint. When compared to a lateral flow device (LFD), such flow-through geometries provide flow paths that are comparatively shorter and therefore provide the capability for implementation of multiple-step assays via more compact device geometries. Additionally, such compact 3D devices can minimise the quantity of reagents that are either required or wasted, in the case of 2D devices, as a result of soaking of the greater lengths and volumes of the porous substrates. Shorter flow paths translate into a reduced fluid distribution or delivery time leading to likely reductions in times for operation of such tests.

So far, for almost all of the reports in the literature, 3D paper-based microfluidic devices have been fabricated by sequential assembly of individual layers of 2D devices. Therefore, in addition to the critical requirement for correct alignment of individual layers, another key challenge encountered in the fabrication of such 3D devices is ensuring sufficient contact between the hydrophilic sections of each layer that constitute the flow-path because any lack of contact will result in an interrupted flow-path. Solutions have been reported for avoiding this problem, which include: 1) forming the structure in a layer-by-layer manner with use of either double-sided tape or a hydrophilic spray adhesive; and 2) applying an outer adhesive, clamp, or protective coating to pre-assembled layers thus holding the layers in contact with each other. Unlike these methods, in this application, we provide a new approach for the fabrication of 3D devices, which extends the technique that has been described in our previous publications for both fabrication of 2D microfluidic devices and implementation of flow-control [19, 24, 25]

In brief, by controlling the laser patterning conditions, we have shown that we can produce solid hydrophobic structures either partially inside a single layer of paper or all the way through several layers of paper. Also, by selectively patterning from both sides of the composite substrate, we have fabricated 3D devices based on both a single layer as well as a multi-layer stacked arrangement. Unlike other 3D device fabrication methods, the approach presented here does not require any additional processing equipment, alignment or assembly steps.

Experimental Examples

Various experimental examples are discussed below. It will be appreciated that the invention is not limited to these particular examples. Below we report the use of a laser-based direct-write (LDW) technique that allows the design and fabrication of three-dimensional (3D) structures within a paper substrate that enables implementation of multi-step analytical assays via a 3D protocol. The technique is based on laser-induced photo-polymerisation, and through adjustment of the laser writing parameters such as the laser power and scan speed we can control the depths of hydrophobic barriers that are formed within a substrate which, when carefully designed and integrated, produce 3D flow paths. We have successfully used this depth-variable patterning protocol for stacking and sealing of multi-layer substrates, for assembly of backing layers for two-dimensional (2D) lateral flow devices or 3D flow devices, and for fabrication of 3D devices within a single layer of substrate. Since the 3D flow paths can also be formed via a single laser-writing process by controlling the patterning parameters, this is a distinct improvement over other methods that require multiple complicated and repetitive assembly procedures. This technique is therefore suitable for cheap, rapid and large-scale fabrication of 3D paper-based microfluidic devices.

In the experimental examples, the laser used for the laser directed write (LDW) process was a 405 nm continuous wave diode laser (MLD™ 405 nm, Cobolt AB, Sweden) with a maximum output power of ~110 mW). The basic LDW setup is similar to FIG. 1 and as described in our previous publications for fabrication of 2D microfluidic devices and implementation of flow-control and has been improved via a series of systematic studies [19, 24, 25]. The results we have achieved and will report in the following sections are therefore based on the same patterning procedure with appropriate adjustment of the patterning conditions such as laser power and scan speed.

The paper substrates used were Whatman® No. 1 filter paper and Polyvinylidene fluoride (PVDF) from GE Healthcare Inc., UK was used for realizing stacking and sealing. Ahlstrom® Grade 320 and 222 chromatography paper from Ahlstrom, Finland, were used for fabrication of backing and 3D structures described below. The photopolymer chosen for these experiments was Sub G, from Maker Juice, USA. The solvent used in development step was Acetone from Sigma Aldrich Co Ltd., UK. The inks used for validating our patterned devices were blue and red bottled inks from Parker, UK.

Stacking and Sealing of Multi-Layer Papers

Figure 3:
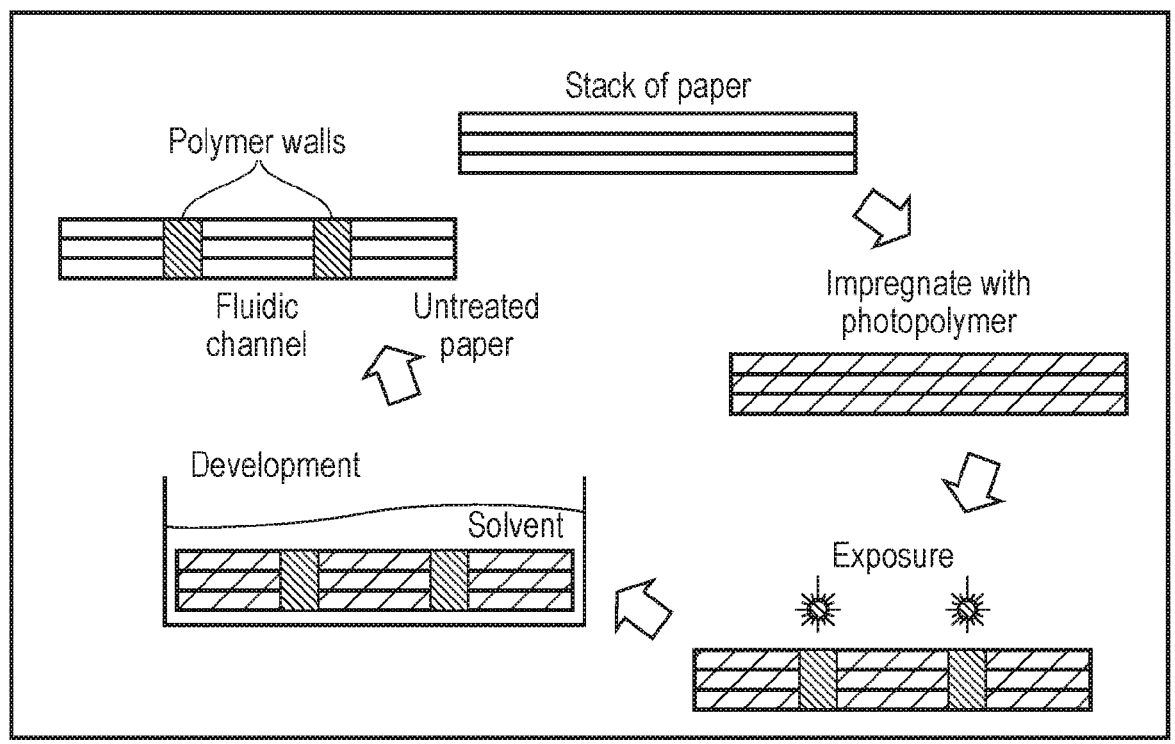
FIG. 3 shows an example of forming fluid flow structures by applying radiation to a stack of multiple layers of substrate.

The photo-polymerization process of LDW is not restricted to a single substrate but can also extend further into a composite formed from several layers. In order to understand and further explore this phenomenon, we prepared samples with different numbers of layers (two to five) and investigated their patterning using the same LDW method. The schematic for this is shown in FIG. 3: firstly, different numbers of cellulose papers were stacked together and then soaked with the photopolymer. The LDW patterning process was applied to form simple structures in these multi-layered samples. In this example, the structures comprise walls extending through the entire thickness of the stack at aligned positions within each of the layers. After the final development process with the solvent, these multi-layers had been efficiently bonded together to form a single composite structure.

Figure 4:
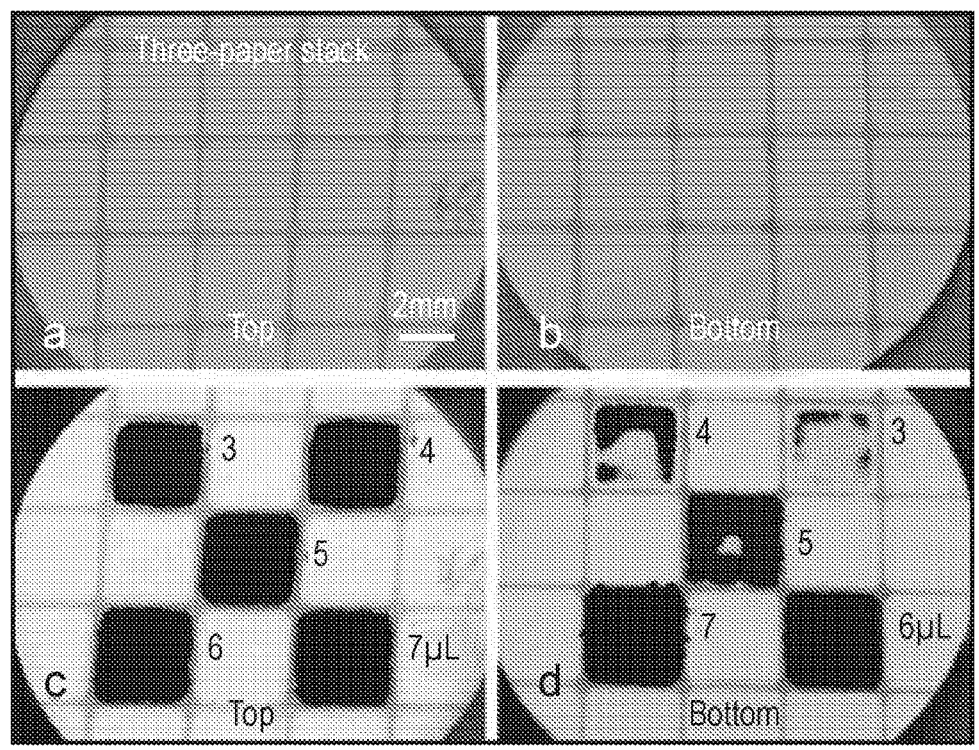
FIG. 4 shows images of structures made using the method of FIG. 3.

FIG. 4 shows images showing the polymerised structures from both sides (a: top side, b: bottom side) of a stack with three layers of cellulose paper and images of both sides of the device (c: top side, d: bottom side) after introduction of blue ink of different volumes (3-7 µL) into the designated well. Based on our current setup with a 405 nm continuous wave (c.w.) laser, we found that three layers of cellulose paper (each with thickness of 180 µm) can be bonded together using a laser output power of 100 mW at a scan speed of 10 mm/s. The polymerised lines were evident throughout all three layers of paper and as shown in FIGS. 4a and 4b, can be clearly observed on both sides of the three-layer stack. We then tested these structures by applying different volumes of blue ink, from 3 µL to 7 µL, into these square wells from the top surface as shown in FIG. 4c. The ink was well-confined within the square wells defined by the polymerised walls and flowed vertically from the upper layer to the layers underneath. The result is shown in FIG. 4d: 3 µL of blue ink is just enough to reach the third layer, while the whole square well of all three layers get fully inked with a volume of 6 µL while 7 µL is seen to produce slight overflowing. It is clear therefore that the polymerised structures that extend from the top layer all the way to the bottom layer perform the dual function of bonding and forming walls that contain and hold the fluid without any leakage, as seen for the image using 6 µL in FIG. 4d.

Using the same parameters, we then attempted to pattern stacks with four layers but although the layers were indeed bonded together, leakage was much more of an issue, so under our normal patterning process conditions, we did not pursue composites with greater than three layers. However, stacked structures with more layers would indeed be possible through choosing different patterning parameters, such as lower scan speed and/or higher incident power.

Figure 5:
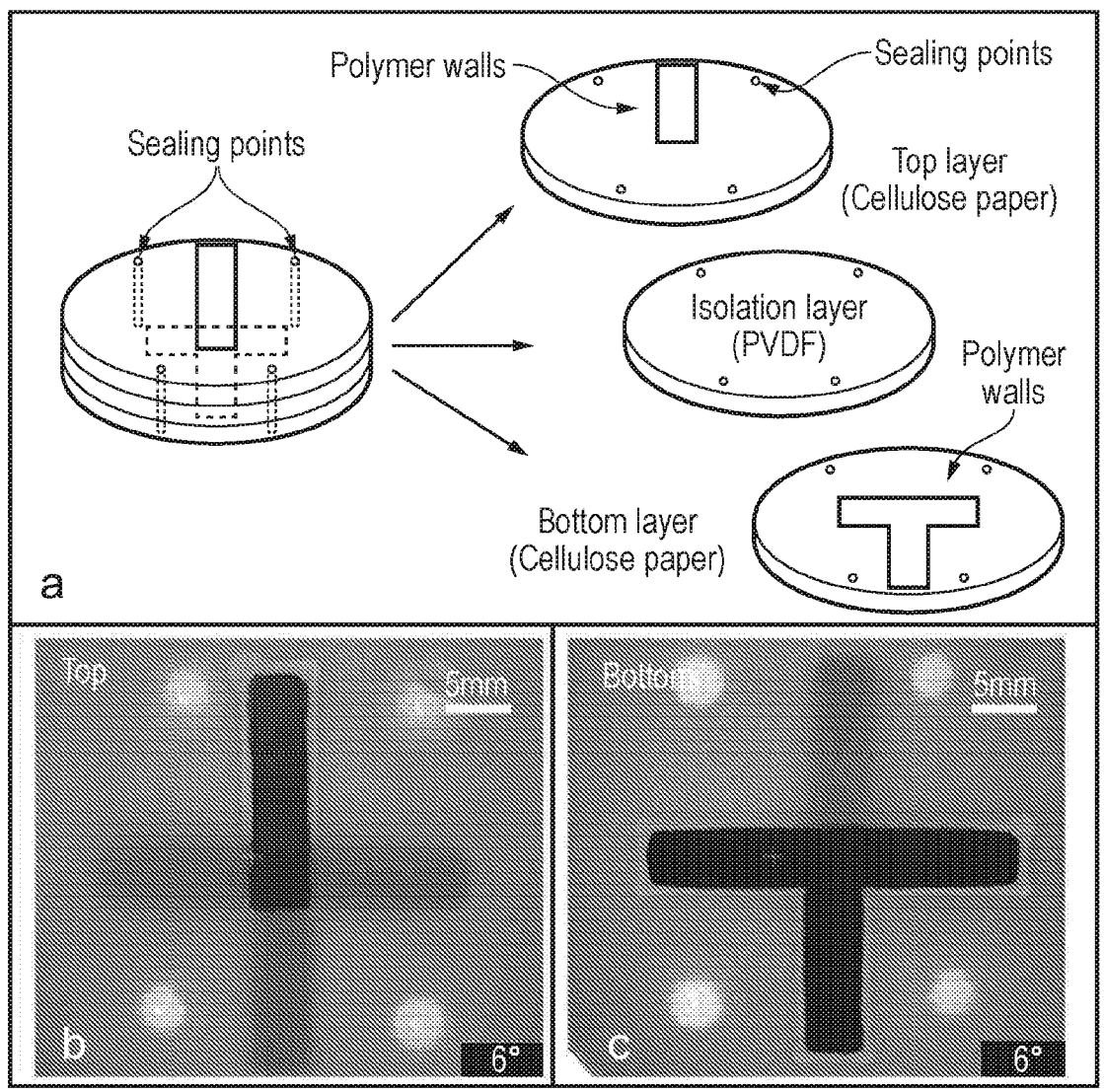
FIG. 5 shows an example of patterning of a stack of layers of dissimilar substrate materials.

Following these first trials we then trialed assembly of multi-layer stacks but this time composed of dissimilar substrate materials. FIG. 5 shows in part a) a schematic image showing the arrangement of a stacked device with different structures in top and bottom layers, which are isolated with a hydrophobic film in between, and in parts b) and c) top and bottom images showing the device described in a) after the introduction of different inks from top and bottom surfaces without any cross-contamination or mixing. The schematic image in FIG. 5a shows our first realisation of a stacked structure using different materials: two layers of cellulose paper with a PVDF layer in between that have been bonded together via a common photo-polymerization process. As shown in the schematic, a rectangular channel and a T-junction were patterned on the top and bottom surface respectively and four sealing points were formed throughout all three layers for bonding. To test the device, red and blue inks were separately introduced onto the top and the bottom surfaces of this stack, and as shown in FIGS. 5b and 5c the inks were guided in the channel and T-junction respectively. From FIGS. 5b and 5c it can also be clearly observed that both inks flow only within their respective layers and did not penetrate through to the opposite layer, due to the presence of the intermediate isolation layer (hydrophobic PVDF). This innovative result presents a solution for not only sealing of paper-based devices by isolating the device between dissimilar outer cladding layers but also, most importantly, permitting 3D pathways to be engineered through judicious assembly of several layers, possibly combined with holes and voids in some layers.

Any paper-based device is normally intended for operation under ambient conditions, which can lead to a number of limitations when compared to fully enclosed microfluidic devices. Two of the main drawbacks are: a) the device is at risk of contamination during the fabrication, transportation and operation, and b) possible evaporation of the fluid in the open air which may lead to change of the sample concentration, or an altered flow rate due to change in sample viscosity. The results we have achieved above can contribute to a reduction of these two limitations by sandwiching a conventional paper-based microfluidic device with two outer layers of hydrophobic material. The LDW technique can be further extended to develop a new approach that helps with sealing in microfluidic paper-based analytical devices (pPAD). Additionally, the technique could also be further employed for permitting 3D pathways through carefully designing the patterning protocol and subsequent assembly of several layers for realisation of a practical 3D paper-based device.

Figure 6:
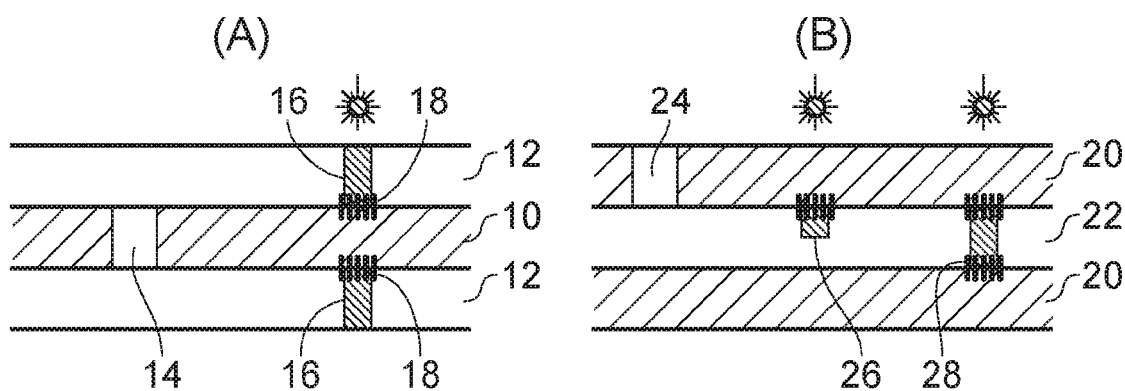
FIG. 6 shows examples of devices formed with a stack of dissimilar substrate layers.

Hence, FIGS. 6(A) and (B) show examples of multi-layer structures that can be formed using this technique. In part (A) of FIG. 6, a stack is provided comprising an isolation layer 10 of hydrophobic material sandwiched between two substrate layers 12 of a porous material such as paper. The isolation layer may include at least one hole 14 to permit flow of fluid between layers at selected locations, but otherwise may block the flow of fluid between the neighbouring porous layers 12. The radiation is applied at a particular part of the substrate to form a wall of less permeable material at aligned positions within the two porous layers 12. This also causes the polymerised substance to bond to the isolation layer at regions 18.

Part (B) of FIG. 6 shows another example in which two hydrophobic layers 20 (e.g. PVDF) sandwich an intervening layer 22 of porous substrate. Again, the hydrophobic isolation layers 20 may have holes 24 to act as fluid inlets. This approach allows an enclosed fluid flow network to be formed within the porous substrate 22 with loss of fluid and contamination prevented by the isolation layers 20. Again, applying radiation at certain points of the substrate converts the radiation-sensitive substance from the first state to the second state within the porous layer 22 to form fluid flow control structures, such as a partial barrier 26 for slowing the flow of fluid or a wall 28 for blocking the flow of fluid.

While these examples show patterning of three-layer stacks, other examples may have four or more layers.

By permitting patterning in multiple layers simultaneously once the stack has already been formed, to form structures in aligned parts of two or more layers of the stack, this greatly simplifies manufacturing of 3D devices since there is no need for complex alignment steps when assembling a stack from individually patterned layers.

Nevertheless, it is also possible for some layers of the stack to include some pre-formed structures before applying the radiation to the stack, to allow more complex networks of fluid flow paths to be formed.

Backing a Paper-Based Device

The presently reported paper-based microfluidic devices have another important limitation—operation of these unbacked devices require that their bottom faces remain isolated from contact with any surface to prevent fluid flow along the interface which would provide an alternative undesirable flow path. In addition to the loss of the fluid (an expensive reagent or valuable sample present in small volumes for example) this unwanted flow can also lead to cross-contamination which in turn may produce a false result or failed test. On the other hand, as paper is normally very fragile and more so especially after getting wet, a backing support to provide mechanical strength would normally be desirable. For the case of nitrocellulose (NC) membrane-based devices, the support to the membrane can be provided by an impermeable polyester layer. While it is easy to procure such pre-backed NC membranes which are extensively used in LFD, it is not yet possible to source similar backed versions of paper substrates from the market. As an alternative, tape is widely used to back paper-based devices, but this has certain drawbacks as the adhesion becomes poor when the paper gets wet following the introduction of the sample; additionally, the adhesives in tapes can diffuse into paper over time, which can lead to contamination as well as affecting the paper's hydrophilicity. Another method of backing paper-based devices is based on flexography printing: a thin layer of polystyrene is printed on one side of the paper to form a hydrophobic backing, but this method requires additional equipment and adds cost to the final devices.

Figure 7:
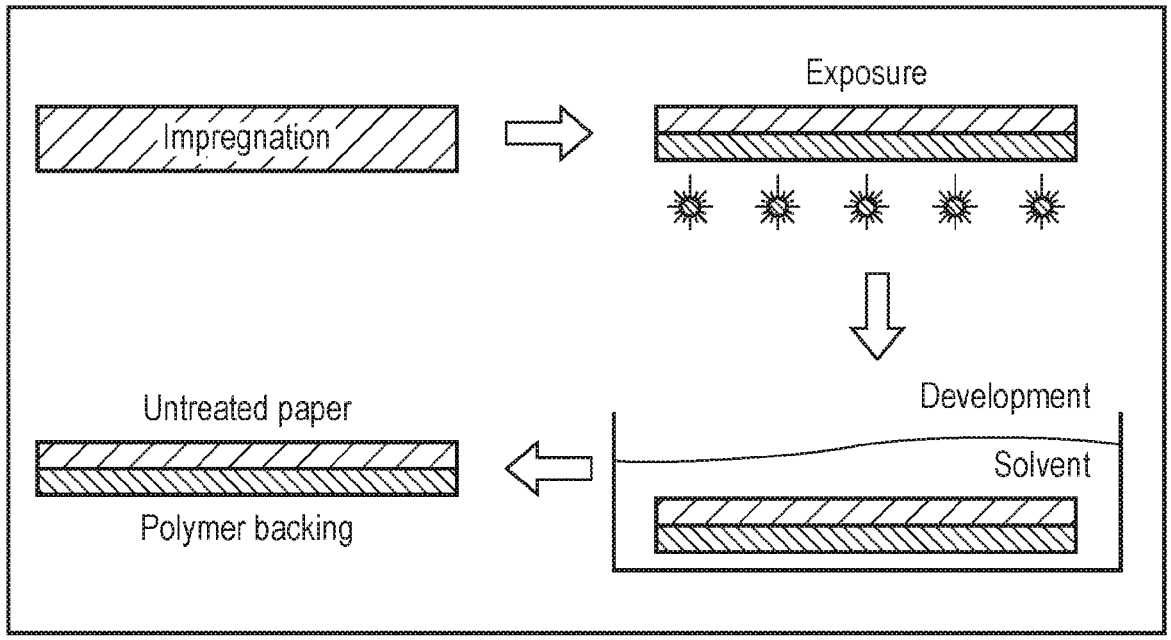
FIG. 7 shows an example of forming a backing layer inside a substrate.

We therefore introduce here the use of our LDW technique as a new solution for backing paper-based devices. We have observed that by controlling the patterning parameters (e.g. laser incident power and scan speed), we can alter the depth of polymerised structures inside the substrate which thereby forms a hydrophobic polymerised layer within the substrate itself, which could be used as the backing layer. Compared with the methods currently used for backing, our LDW method allows formation of a backing structure inside the substrate during the device fabrication procedure without any need for extra materials or equipment, which would then lead to cost reduction and simplicity of fabrication. The schematic illustrating this is shown in FIG. 7: the paper substrate is first impregnated with photopolymer, then during the exposure step the laser parameters are selected to polymerise only to a certain depth inside the substrate. After the final development process, the un-polymerised material is washed away, leaving behind a polymer layer with a specified depth inside the substrate, which thereby serves as the required backing.

Figure 8:
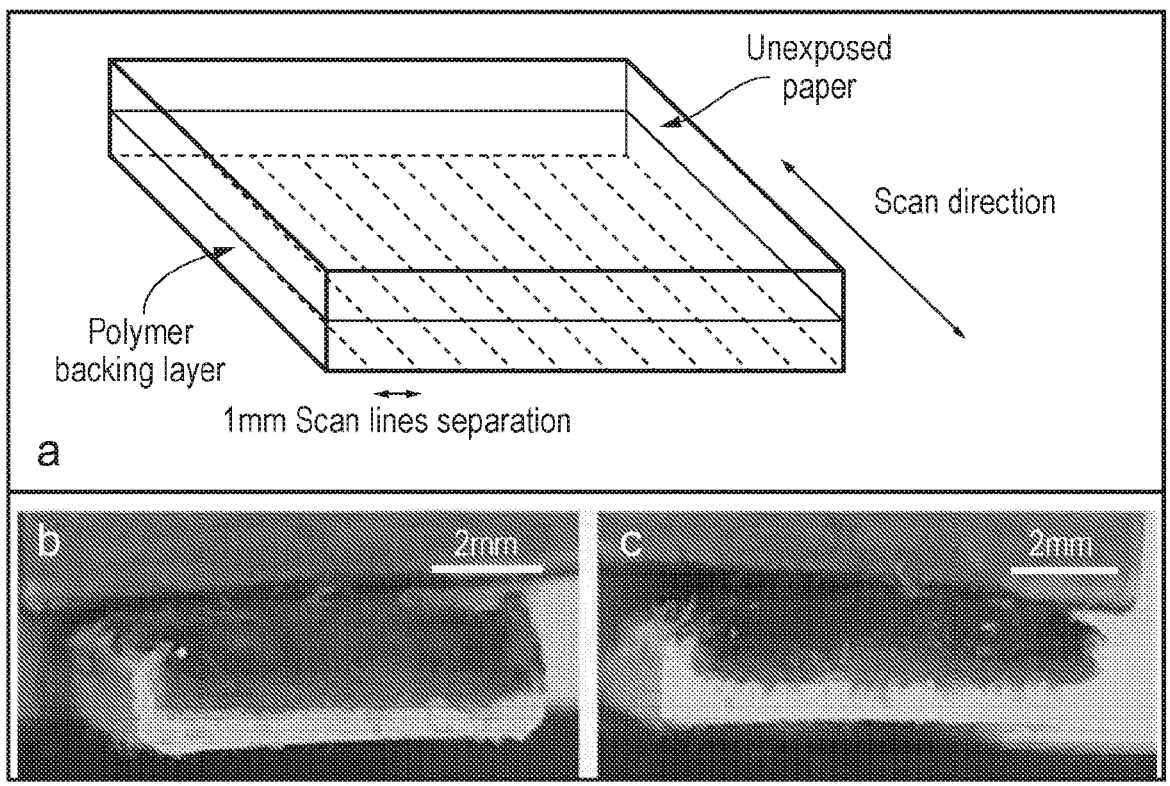
FIG. 8 shows a schematic illustration of patterning a backing structure by scanning a laser beam across the substrate in a line-by-line manner.

We therefore performed a parametric study to understand the influence of different patterning parameters, which also included a number of repetitive scans. FIG. 8 shows in part a) a schematic of patterning a backing structure by scanning the laser beam across the substrate in a line-by-line manner (in this example with a separation of 1 mm), and in parts b) and c) cross-section images showing polymerised layers (un-inked white layers) on one side of thick cotton fibre filter paper with different thickness of: 700 µm in part b), and ~1 mm in part c), after introduction of red ink from the other side. The basic LDW setup is the same as described previously and the paper substrates used were Ahlstrom® Grade 320 chromatography paper with a thickness of 2.48 mm. As a proof-of-principle, in order to form a backing structure, we scanned the laser beam across the substrate in a line-by-line manner with a centre-to-centre separation of 1 mm (as shown in FIG. 8a), which was appropriate for the lines to just touch each other without any significant overlap or gaps. By forming adjacent polymerised lines under the same writing conditions, it was possible to create a 2D polymerised layer inside the substrate.

The cross-sectional images in FIGS. 8b and 8c show examples of a patterned paper with different thicknesses of polymerised layers formed at the bottom of the substrate that was achieved by simply altering the patterning parameters. As shown in FIGS. 8b and 8c, after introducing red ink from the un-polymerised side, we could clearly identify the polymerised layers (white region). As seen in the images: the thickness of the polymerised structures increases from ~700 µm to ~1 mm with an increase of laser output power from 30 mW to 70 mW at a fixed scan speed of 5 mm/s. As shown in both images, the polymerised layer, although written in a line-by-line manner was continuous and uniformly thick, and the demarcating interface between the un-polymerised and polymerised section is clearly defined.

Figure 9:
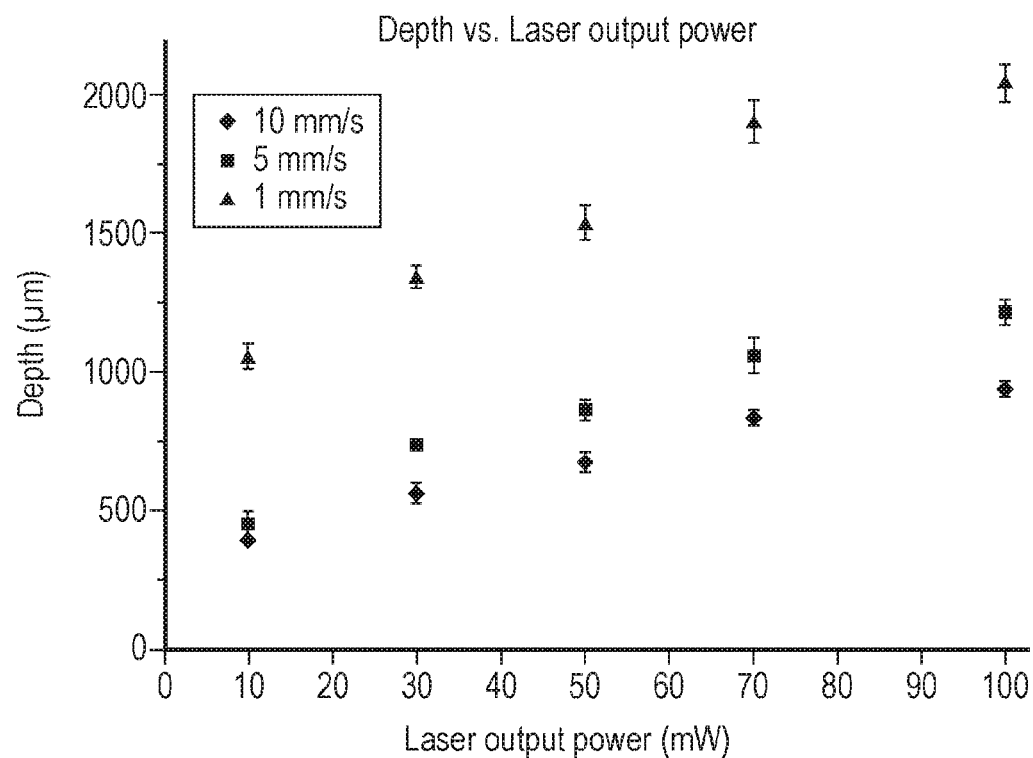
FIG. 9 is a graph showing the variation in depth of the backing layer for different laser powers at three different scan speeds.

To further study the depth of the polymerised layers as a function of the patterning parameters, we performed a study with the results shown in FIG. 9, which shows plots showing the variation in the depth of the polymerised layers for different laser powers at three different scan speeds. Error bars indicate the standard deviation for 5 measurements. For a fixed scan speed, as expected, the depth of the polymerised layer increases with an increase of the incident laser power. For example, at a fixed scan speed of 10 mm/s, the depth of the polymerised layer increases from ~400 µm to ~950 µm with an increase of laser output power from 10 mW to 100 mW. Similar behaviour was observed with a layer depth increase from 450 µm to ~1050 µm and ~1200 µm to ~2050 µm at a fixed scan speed of 5 mm/s and 1 mm/s respectively for incident laser power ranging from 10 mW to 100 mW. As expected, we can also observe from the same plots that the depth of the polymerised layers increases with the decrease of the scan speed at fixed laser powers.

Figure 10:
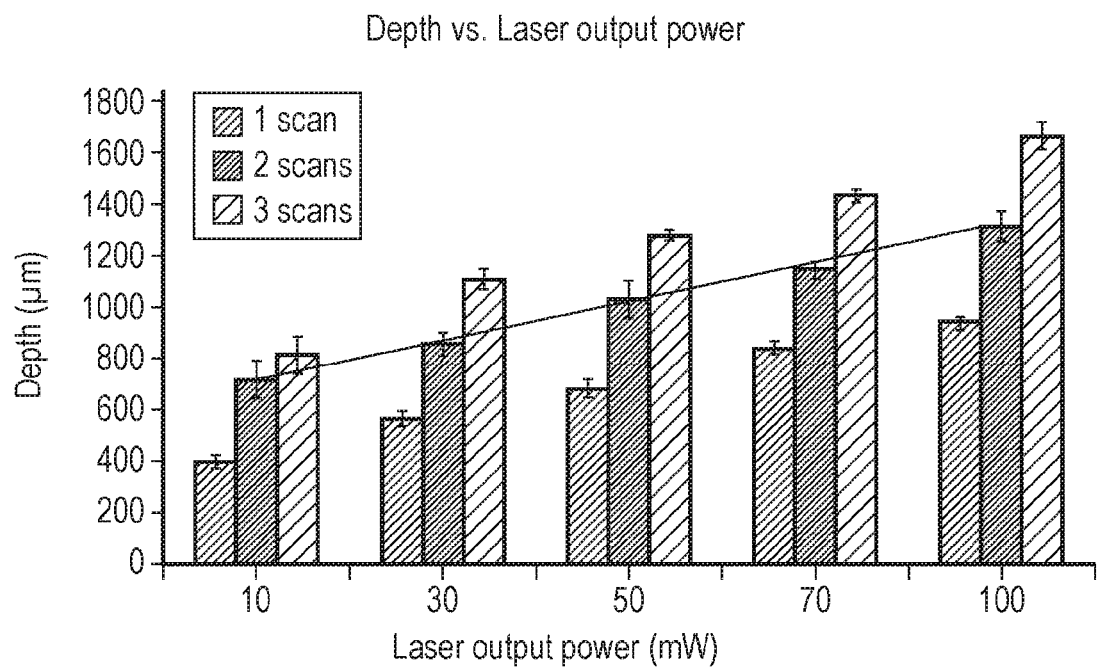
FIG. 10 is a plot showing variations in depths of the backing layer for different laser powers at a fixed scan speed for different numbers of scans.

Additionally, we observed that the depth of a single polymerised line also depends on the number of scans performed under the same writing conditions, which thereby alters the resulting thickness of the polymerised backing layers. In order to study how the number of scans affects the polymerised depth, we scanned the beam once, twice and three times respectively under the same writing conditions. FIG. 10 shows plots showing the variations in the depths of the polymerised layers for different laser powers at a fixed scan speed of 10 mm/s for three different numbers of scans. Error bars indicate the standard deviation for 5 measurements and a linear line for the case of 2 scans is a simple guide for the eye. The histogram in FIG. 10 shows that the depth of the polymerised layer increases monotonically with an increasing number of repeat scans. As shown in the plots, the depth of the polymerised layer increases from ~400 µm to ~800 µm with an increase of the number of scans from one to three at a patterning condition of 10 mW of incident power at 10 mm/s scan speed. Similar trends were observed for all laser powers used (30, 50, 70 and 100 mW) for the same scan speed of 10 mm/s.

Reduction in the Dead-Volume of a Paper-Based Device

An additional benefit of this technique lies in the reduction of the active paper volume that can be produced routinely for all such test substrates, which leads to a corresponding reduction of reagent/sample volume required. Due to the opacity of the substrate, the observable signals (the colour change) that provide the test results originate only from the top region or plane of the substrate (which for a nitrocellulose membrane extends below the surface to a depth of ~10 µm), and any colour change from deeper regions (the so-called dead volume) makes a negligible contribution to the observable signal, and is therefore redundant. Reduction of the thickness of the substrate at the detection area will therefore not only help with saving of reagent/sample but will also help increase the limit of detection. Because the amount of the sample which previously would have soaked the entire volume of the substrate will now instead fill up a comparatively smaller volume of the substrate, the sample concentration will be relatively higher and thus will lead to an improved limit of detection.

Figure 11:
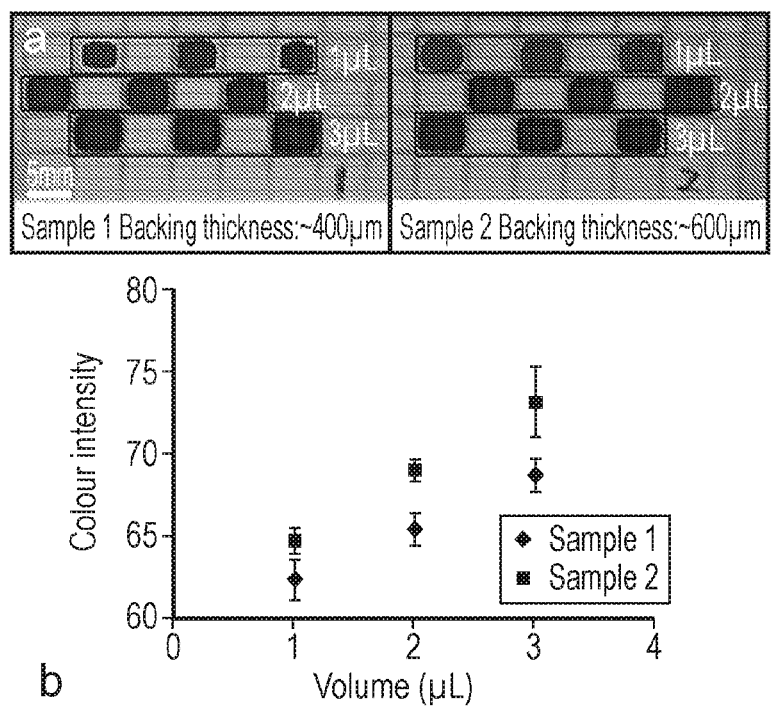
FIG. 11 shows results of introducing different volumes of ink into well structures patterned in two samples with different backing thickness, and a plot showing the colour intensity for a given volume of ink in each case.

To test this hypothesis, as shown in FIG. 11a, a simple proof-of-principle experiment was performed by introducing different volumes (1, 2 and 3 µL) of red ink into 4×5 mm well structures patterned on samples 1 and 2, which were backed with layers that had different thickness of ~400 µm and ~600 µm, using the LDW method. FIG. 11 shows in part a) images of the samples with the ink introduced, and in part b) plots constructed using the grayscale intensity values taken from the images shown in (a). Error bars indicate the standard deviation for 3 measurements. The paper substrates used for both samples were Ahlstrom® Grade 222 chromatography paper with a thickness of 0.83 mm. As shown in FIG. 11a, the colour intensities change in each well with different ink volumes and also differ between the two samples with different thickness of backing for the same volume. The images were processed with the ImageJ software (National Institutes of Health, USA) to extract the respective grayscale colour intensities of the red colour produced within the central area of each well and the results are plotted in FIG. 11b. The conclusion here is that the detected colour intensity increases with an increase of the ink volume, but more importantly, also increases with an increase of the backing thickness, i.e. the signal is enhanced with a reduction of the dead volume. We therefore believe that by designing and choosing the appropriate thickness of the backing, we should be able to control the volume of substrate and hence reduce the dead volume thereby increasing the sensitivity and saving on sample or reagent needed.

In summary, we have proved that by simply changing the patterning parameters, we can polymerise lines with different depths in the substrate, and therefore, by scanning lines in a line-by-line manner we could form polymerised layers with the desired depths, and these can be used either as backing for paper-based devices or to alter the volume of the paper-based fluidic device. Here, for our first simple proof-of-principle experiment, we have used a line-by-line scanning procedure in order to cover a large area. Alternatively, instead of repetitive multiple scanning protocols, a single-step process that uses a cylindrical lens could also be employed. In this case the lens focuses the beam only in one direction and leaves the other direction wide enough to cover an extended lateral region.

Dual-Sided Polymerisation—for Fabrication of a 3D Paper-Based Device

Figure 12:
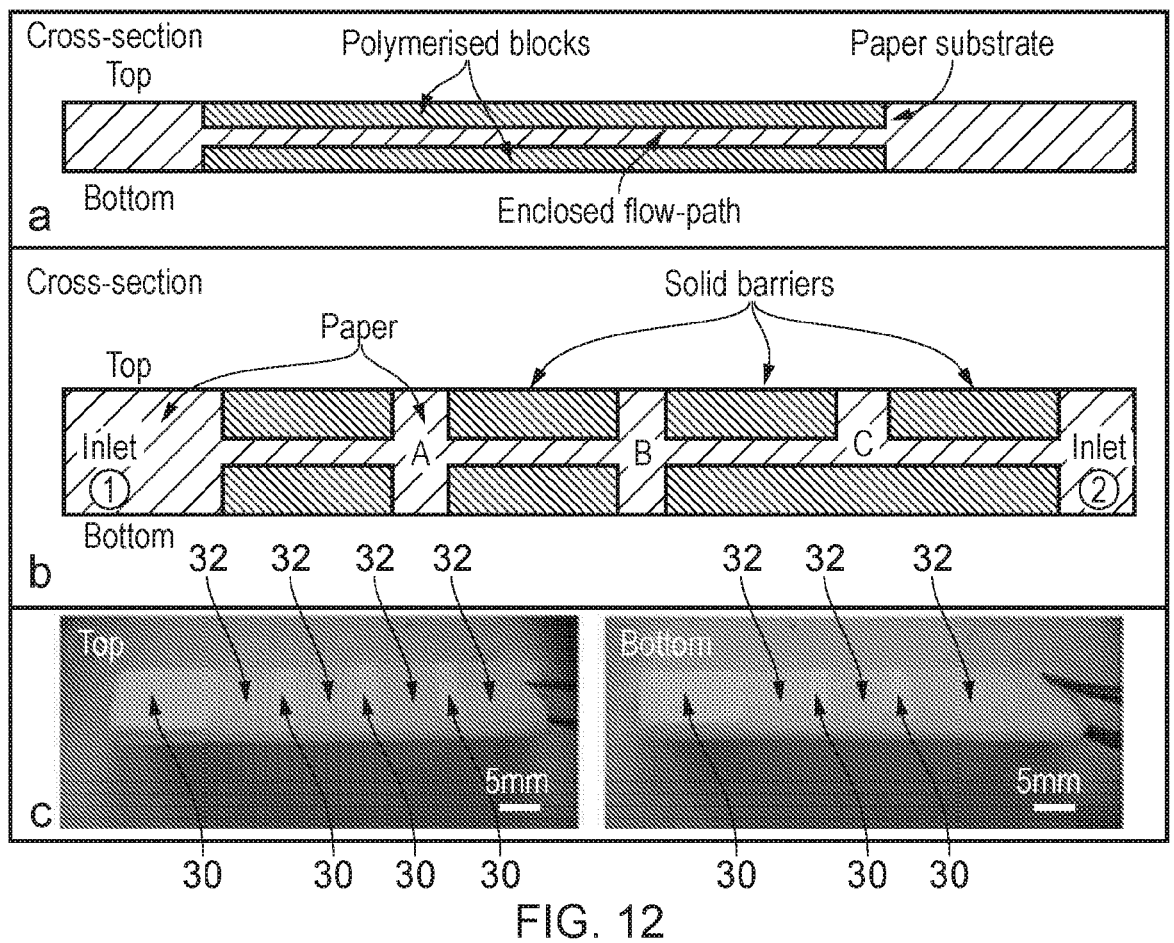
FIG. 12 shows an example of forming an enclosed flow path by creating cladding blocks at both surfaces of a single layer of substrate.

We have also created polymerised patterns though exposure from either side of a single substrate. The objective here was to use this dual-sided polymerisation protocol to fabricate a 3D device in a single paper substrate. The concept is explained through the schematic depicted in FIG. 12. FIG. 12 shows in part a) a schematic showing an enclosed flow-path formed by creating polymerised blocks from both faces of a single paper substrate, in part b) a schematic representation of cross-section of a 3D fluidic device with two inlets (①②) from either end, and in part c) Photographic images taken from the top and bottom of the device described in b).

As shown in FIG. 12(a), by patterning via exposure from both the top and bottom faces of a single paper substrate it is possible to create polymerised blocks that extend partially from both faces of the substrate and define an enclosed flow-path that is embedded within the substrate. By selectively positioning and connecting such polymerised areas, we can then construct arbitrarily-shaped connected 3D flow paths that guide the fluid both in the horizontal and vertical directions. The schematic in FIG. 12(b) shows an example of such 3D paper-based devices created in a single substrate with several fully enclosed and interconnected channels. As shown in the cross-section schematic, solid polymerised barriers were formed from both top and bottom, leaving gaps in both vertical and horizontal directions. The gaps in the vertical direction form three open windows A, B and C, where the reagent/sample will appear after passing through the enclosed channels between the two inlets (①②). The enclosed channels that connect the inlets and three open windows are defined by gaps between the solid barriers in the horizontal direction. Photographic images of the top and bottom views of a real device with the illustrated arrangement are shown in FIG. 12(c): the white areas 30 are bare/un-polymerised sections of paper and the pale yellow areas 32 are the hydrophobic polymerised regions.

Figure 13:
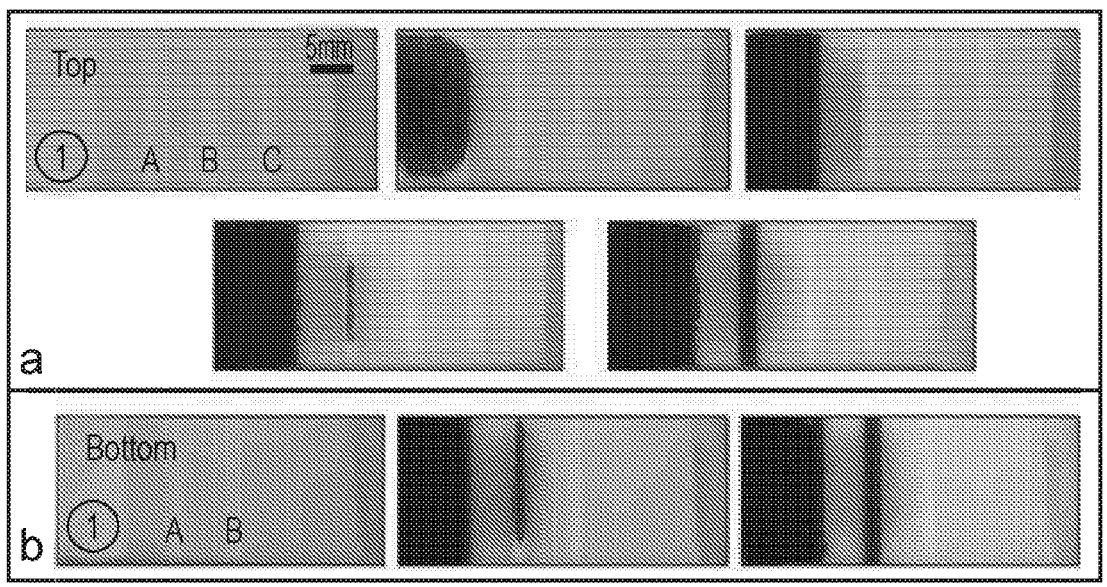
FIGS. 13 to 15 show images of devices created using the technique shown in FIG. 12.

In order to test these 3D structures, we first introduced red ink from the inlet of the device described in FIG. 12b. The sequential images in FIG. 13 show the flow of red ink, which were taken from both top and bottom faces of the device. After the introduction of the ink, it flowed into the first enclosed channel between inlet Di and the open window A. The red shaded areas were observed from both sides of the device and illustrate the ink flow inside the channel. After a short period of time, the ink flowed through the first section of the enclosed channel and reached the open area A: as shown in the images the red ink has filled in the area A and is visible from both top and bottom.

Figure 14:
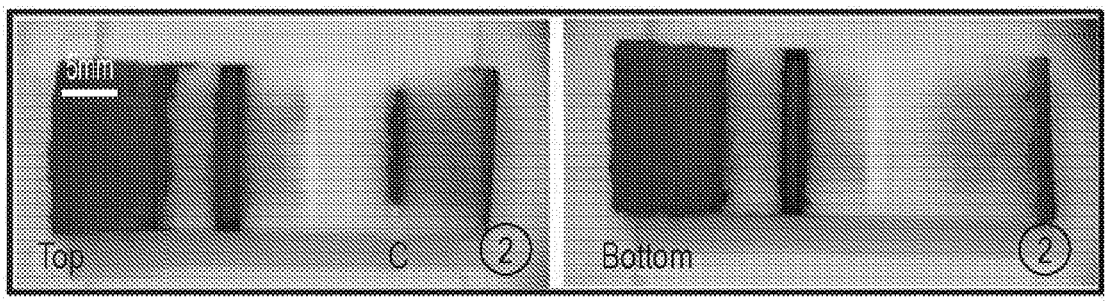

We have also introduced red ink from the inlet and the result is shown in FIG. 14. The ink again flowed through the enclosed channel between inlet and the open area C and finally reached the open window C and hence appeared on the top side. The difference of the structures in the right and the left sections of the device is that the polymerised structures at the bottom cover the whole area without having an open window. It can be regarded as a 3D device with an enclosed channel and an open window just on the top plus a backing structure underneath, which helps to provide support to the device.

Figure 15:
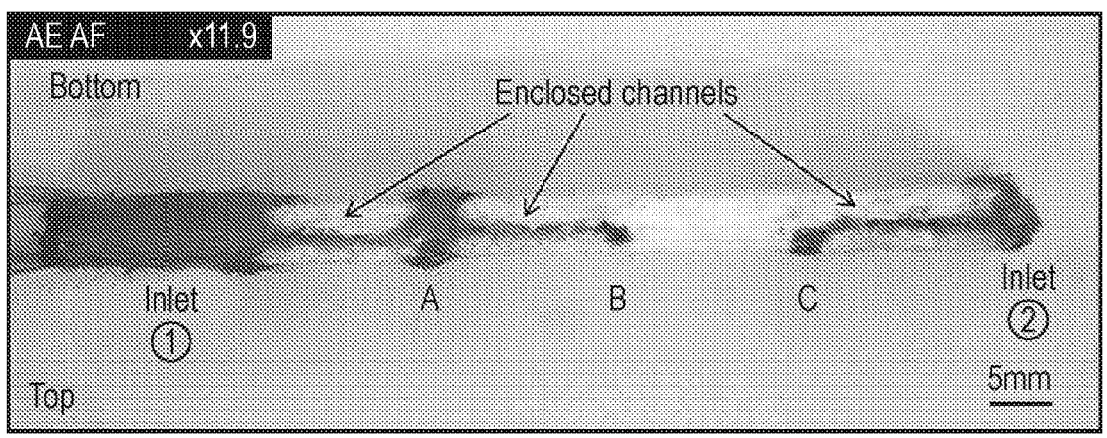

Finally, the cross-section image in FIG. 15 illustrates the flow process of the red ink inside this 3D device. The narrow red lines inside the substrate, which connect the inlets and open areas, show the flow of the red ink inside the enclosed channels. The ink from inlet ① flowed and filled up the open area A, which allows the ink to be seen from both top and bottom, through an enclosed channel in between and then kept flowing towards the open area B along another enclosed channel. Similarly, the ink filled in the open area C and shows up only from the top with the source from the inlet ② again through an enclosed channel inside the substrate that was formed with solid blocks on both sides. Such fully enclosed channels can be achieved easily with our LDW method, which prevents liquid exchange between the exterior and the interior of the channel.

Hence, through selectively designing and patterning polymerised structures from both sides of the substrate, we can fabricate 3D structures inside a single substrate. Unlike other 3D device fabrication methods, the approach presented here does not require any additional processing equipment or alignment/assembling step and uses the same fabrication approach described earlier for producing a 2D fluidic device.

SUMMARY

In summary, we have proposed and demonstrated a novel method which can be used for stacking and sealing, fabrication of backing structures and construction of 3D structures in paper or porous substrates. The method is based on the LDW technique we have reported previously with modification of the patterning parameters during the fabrication procedure, so that the polymerization process can extend through multiple layers of substrate that are stacked together. This can be used for sealing the devices in order to solve potential evaporation and contamination problems. By changing the patterning parameters, a polymer backing layer with a specific thickness can be patterned within the paper substrate itself, which can be used as backing for paper-based devices instead of the currently used tape or polyester film. In addition, the thickness of this polymerised layer can be controlled to reduce the paper volume, which in turn allows reduction of the required reagent/sample volume and most importantly, can be used to increase the limit of detection.

Finally, we showed the possibility of fabrication of 3D paper-based devices as the polymerised structure can be formed inside the substrate with a controllable thickness. As a result, through selectively designing and patterning some of these polymerised structures from both sides of the substrate, we could fabricate 3D structures inside a single layer of substrate. Unlike other 3D device fabrication methods, our LDW approach does not require any additional processing equipment or alignment/assembling steps and uses the same fabrication approach that is applied for producing a 2D fluidic device by simply altering the patterning parameters.

Device Types and Configurations

Clearly, a wide range and variety of flow devices and structures on porous substrates can be fabricated using the methods described herein. As mentioned, the shape of the fluid-containing regions can vary, e.g. including channels along which fluid may flow, which may have a fixed or a varying width and follow straight, spiral or serpentine paths. Reservoirs, wells and the like may also be used. These may be self-contained for confining received fluid (in the manner of a microtiter plate, for example), or may be connected to other regions by one or more channels, to give a fluid flow network. A single substrate may include more than one network, or multiple self-contained regions. Any number of sample or analyte introduction locations can be connected to any number of test zones or locations via any number, shape and pattern of flow channels.

As discussed above, it is possible to form walls which are fully impermeable to the fluid and extend through substantially the full thickness of the substrate, by depositing radiation-sensitive substance which extends right through the substrate, and exposing that substance to sufficient light energy to solidify it through the full substrate thickness. However, the invention is not so limited, and may also be used to form barriers within flow channels and other fluid-containing regions which are partially permeable. Such barriers, being volumes of solidified polymer within a flow channel which extend through only part of the substrate thickness, or which extend through the full thickness but are in a partially permeable state, can be added to any of the channels or other network structures to control flow within the channels, where the barriers may have a substantially constant thickness to reduce fluid speed, or may have a thickness variation along the flow direction to produce one-directional flow. Varying depth barrier profiles can also be used for delay alone. Thus, the barrier, by forming an obstacle within a flow channel, acts to impede the flow of fluid past the barrier. According to embodiments of the invention, partial barriers of this type can be formed by depositing radiation-sensitive substance onto the substrate within a region intended to receive fluid (such as between the walls of a channel) and applying sufficient light energy to cause hardening through only part of the substrate thickness. This can be achieved by depositing the radiation-sensitive substance such that it extends only partly through the substrate thickness and then fully solidifying all of that substance by light exposure, or by depositing the radiation-sensitive substance to extend through most or all of the substrate thickness and solidifying only part of the thickness of the substance by applying a reduced amount of radiation. The former technique may be preferred since it may leave less residual unsolidified polymer within the fluid network. Alternatively, the porosity of a barrier can be controlled depending on the radiation energy used, to provide varying degrees of delay to fluid flow. A partial barrier can be defined by a particular line of the deposited pattern that occupies an area within a region intended for fluid, so that both full thickness walls and partial barriers can be formed by a single application of a method according to the invention. Alternatively, the method may be used to create partial barriers only, perhaps within an existing fluid network already fabricated in a substrate by any technique. The structure and use of partial barriers is explained further in [20], [21] and [22].

The radiation-sensitive substance may be deposited on the surface of the substrate and then may spread through the thickness of the substrate so that when converted to the second state under the application of radiation, the radiation-sensitive substance forms less permeable walls or barriers within the substrate.

However, it is also possible to form structures on the surface of the substrate using the present technique. For example, when the radiation-sensitive substance is deposited, while some of the substance may soak through into the substrate, a film of substance may remain on the surface of the substrate for some time after depositing the substance. If the radiation is applied while there is still a pattern of substance remaining on the surface of the substrate, then when the radiation is applied the surface substance will also be converted to the second state, forming "bumps" which project above the surface of the substrate. This can be useful, for example, when wells or channels are formed within the substrate for containing or guiding fluid, as the surface bumps can prevent fluid spilling out of the wells or channels over the surface of the substrate.

A colour change caused by the reaction between analyte and reagent at a test site on a device can be employed to encode the result of the test such that it can be read automatically, or only understood by a healthcare professional. For example, the substrate may be printed with a one- or two-dimensional pattern similar to a bar code or a QR code. A colour-change reagent may be embedded at one or more locations within the pattern in a colourless manner; these are connected to an analyte introduction site elsewhere on the substrate by one or more channels. Analyte introduced onto the substrate will flow to the test location(s), and possibly cause a colour change at the location(s) depending on a positive or negative test. The colour change will alter the shape of the pattern, which can then be read by a hand-held scanner or photographed by a mobile telephone or tablet camera for communication to a remote diagnostic facility or website, and interpreted accordingly. Other information, such as type of test, and patient identity, could be encoded in the test pattern also, to further facilitate automated testing.

Fluid flow devices according to embodiments of the invention are not limited to medical applications such as diagnostics. Biological and chemical sensors in lateral flow test formats for sample testing are also required in fields including veterinary medicine, the food, beverage, water and pharmaceutical industries, agriculture, environmental sensing, and defence & security applications. The invention can provide devices for use in all of these fields, and any other requiring fluid sample testing.

Substrates

A variety of materials may be employed as a substrate for the present invention. Typically, the substrate will be planar, such as a sheet or layer of material. Paper has been found to be of particular interest, since it is readily available in a range of thicknesses, densities, porosities and colours, is inexpensive, can be easily cut to size, can be printed with instructions, directions and indicia, can be folded, and is lightweight. However, other porous materials may be used instead, such as cardboard, or woven and non-woven fabrics made from natural or synthetic fibres and combinations thereof. The substrate material should be able to withstand exposure to the required radiation energy density without suffering unacceptable ablation or other damage, and be able to undergo any subsequent processing steps needed to produce the finished device. A material which displays these characteristics may be used as the substrate in the present invention. The properties and characteristics of potential substrate materials can be compared when selecting a potential substrate for a particular device. A property of particular interest is the density of the material as expressed through its internal structure, or its pore sizes, since this will affect the size of the solid structures which may be written into it. A material with an open structure (such a large-grained paper with wide grain spacing) may have a minimum barrier width that is able to fully contain fluid within a region, so that thinner structures cannot be used on such a substrate. This may affect the overall minimum device size which is achievable.

Another substrate material of special interest is nitrocellulose. Nitrocellulose membranes have particular application in point-of-care biosensor devices (such as pregnancy tests) since the material has a range of advantages. It has a high binding affinity for proteins, it produces only a low background signal, and is compatible with a variety of detection methods including chemiluminescent, chromogenic and fluorescent techniques. Also, the manufacture of nitrocellulose, which is well-established at the industrial scale, can be controlled to produce pores of specific sizes which are large enough to allow fluid flow as required by the present invention.

Other examples of substrates may include sintered materials such as sintered glass or sintered plastics.

Some substrate materials may have wicking ability, which can be useful because this allows a fluid to be drawn along a channel in the required fluid flow and the radiation-sensitive substance can be drawn down through the substrate thickness in the deposition stage.

Other materials may not have an inherent wicking ability, and instead the fluid flow may be controlled by the application of an external factor, such as an electric field or exposure to radiation. This can be useful for example because the fluid flow device may take a fluid sample at the point of care, but then may need to be inserted into a device reader or other apparatus in order to carry out the actual analysis of the sample. If there is a delay in transferring the device to the reader, then if the fluid naturally flows through the substrate, by the time the device reaches the reader the fluid may already have flowed through the fluid flow network and out of the device preventing appropriate analysis. This problem can be avoided if the fluid does not naturally flow through the substrate unless an external factor is applied.

For example, if the fluid is an ionic fluid, an electric field could be applied by the reader to trigger the flow of fluid.

Alternatively, if the fluid is not itself ionic, flow of fluid may be controlled by varying the wetting properties of the structures in the fluid flow network. For example, the wetting properties (e.g. hydrophobicity) of some materials may change when an electric field is applied or when electromagnetic radiation is applied. Such a material may be injected to coat the insides of the structures formed by the method above, so that they retain the fluid in an initial state and become more hydrophobic on application of the electric field or exposure to electromagnetic radiation, so that fluid starts to flow.

In some examples, different types of substrates can be joined to form a composite substrate, and then form the structures on the composite substrate using the method described above. This can be useful for providing different fluid flow rates in different parts of the composite substrate, for example.

Radiation Sources

The radiation applied in the method of the present technique may be any form of radiation capable of changing the deposited material from a first state to a second state, where the substance is less permeable, more solid and/or less soluble in one of the first state and the second state than the other.

In one embodiment, the radiation comprises electromagnetic radiation. Electromagnetic radiation of any desired wavelength may be used. Preferred forms of radiation include ultraviolet radiation (typically defined as electromagnetic radiation having a wavelength of 20 to 400 nm) and visible light (typically defined as electromagnetic radiation having a wavelength of 400 to 700 nm).

Other sources of radiation may include ion beams, electron beams, and ultrasound, for example.

Lasers provide convenient sources of radiation, since their beams can be focused to a small spot size, a range of wavelengths are available, power can be easily adjusted, and beam scanning is readily implementable. However, other radiation sources may be used if preferred. For example, the radiation source may be a supercontinuum source, one or more light emitting diodes, or other source which is sufficiently bright and of the proper wavelength to produce the required transformation of the radiation-sensitive substance into the hardened state. The wavelength may also be selected having regard to the properties of any reagent to be provided in the fluid flow device, as discussed above.

The radiation spot as exposed onto the surface of the substrate can be produced by any arrangement which gives a spot of sufficient intensity or energy density to induce the state change in the radiation-sensitive substance. Often, this will be an arrangement such as focusing or imaging of the incident light beam which substantially reduces the spot size (while giving a spot of the required dimension for the line which is to be polymerised) so as to give a significant increase in the energy density of the beam. An unfocussed beam may be used instead, however. The light beam will generally be exposed directly onto the substrate surface to define the writing spot on the substrate surface, subject to any lenses, mirrors and the like used to form, shape and direct the light beam into the required spot size and shape. "Directly" indicates that there is no intervening mask or similar, such as is required in lithographic techniques.

The light source may provide a continuous emission of light or a pulsed emission, for example a laser source that produces regular or irregular pulses with durations on the nanosecond, picosecond or femtosecond scale. The terms "light beam", "beam", and "beam of light" are used in the context of the present invention to include both the continuous and pulsed alternatives.

It is also possible to apply more than one source of radiation to the same device. For example, sources of radiation of different types may be provided (e.g. ambient light and laser light, or ion beam radiation and laser light). Also, the different sources of radiation could provide radiation of different wavelengths, frequencies or energy density, for example. This can be used to provide further control of the formation of structures in the device. For example, the different sources may provide different depths or degrees of conversion of the radiation-sensitive substance from the first state to the second state, which can provide structures with different permeability to the fluid. For example, one source of radiation (e.g. a first laser) could be used to form walls and another source (e.g. a laser of different frequency or energy) could form barriers. In another example, the different types of radiation could for example correspond to different types of laser such as a pulsed laser and a continuous wave laser (see for example the experimental work below where pulsed and c.w. lasers can be used to form different kinds of barrier).

In some cases, the different sources of incident radiation may be applied in series so that a first source is applied initially, and later a second source is applied.

It is also possible to use simultaneous sources of radiation in parallel, so that multiple structures or barriers can be created at the same time. For example, a beam of radiation could be split into multiple beams each of which may be used to write a line, wall or barrier.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

REFERENCES

[1] P. Yager, T. Edwards, E. Fu, K. Helton, K. Nelson, M. R. Tam, and B. H. Weigl, "Microfluidic diagnostic technologies for global public health," Nature 442, 412-418 (2006)

[2] X. Li, D. R. Ballerini, and W. Shen, "A perspective on paper-based microfluidics: Current status and future trends," Biomicrofluidics 6, 11301-1130113 (2012)

[3] R. Pelton, "Bioactive paper provides a low-cost platform for diagnostics," Trac-Trends Anal. Chem. 28, 925-942 (2009)

[4] A. K. Yetisen, M. S. Akram, and C. R. Lowe, "Paper-based microfluidic point-of-care diagnostic devices," Lab Chip 13, 2210-2251 (2013)

[5] A. W. Martinez, S. T. Phillips, M. J. Butte, and G. M. Whitesides, "Patterned paper as a platform for inexpensive, low-volume, portable bioassays," Angew. Chem.-Int. Edit. 46, 1318-1320 (2007)

[6] WO 2008/049083

[7] WO 2012/125781

[8] D. A. Bruzewicz, M. Reches, and G. M. Whitesides, "Low-cost printing of poly(dimethylsiloxane) barriers to define microchannels in paper," Anal. Chem. 80, 3387-3392 (2008)

[9] K. Abe, K. Suzuki, and D. Citterio, "Inkjet-printed microfluidic multianalyte chemical sensing paper," Anal. Chem. 80, 6928-6934 (2008)

[10] X. Li, J. F. Tian, T. Nguyen, and W. Shen, "Paper-Based Microfluidic Devices by Plasma Treatment," Anal. Chem. 80, 9131-9134 (2008)

[11] E. M. Fenton, M. R. Mascarenas, G. P. Lopez, and S. S. Sibbett, "Multiplex Lateral-Flow Test Strips Fabricated by Two-Dimensional Shaping," ACS Appl. Mater. Interfaces 1, 124-129 (2009)

[12] Y. Lu, W. W. Shi, L. Jiang, J. H. Qin, and B. C. Lin, "Rapid prototyping of paper-based microfluidics with wax for low-cost, portable bioassay," Electrophoresis 30, 1497-1500 (2009)

[13] E. Carrilho, A. W. Martinez, and G. M. Whitesides, "Understanding Wax Printing: A Simple Micropatterning Process for Paper-Based Microfluidics," Anal. Chem. 81, 7091-7095 (2009)

[14] X. Li, J. F. Tian, G. Garnier, and W. Shen, "Fabrication of paper-based microfluidic sensors by printing," Colloid Surf. B-Biointerfaces 76, 564-570 (2010)

[15] J. L. Delaney, C. F. Hogan, J. F. Tian, and W. Shen, "Electrogenerated Chemiluminescence Detection in Paper-Based Microfluidic Sensors," Anal. Chem. 83, 1300-1306 (2011)

[16] J. Olkkonen, K. Lehtinen, and T. Erho, "Flexographically Printed Fluidic Structures in Paper," Anal. Chem. 82, 10246-10250 (2010)

[17] W. Dungchai, O. Chailapakul, and C. S. Henry, "A low-cost, simple, and rapid fabrication method for paper-based microfluidics using wax screen-printing," Analyst 136, 77-82 (2011)

[18] G. Chitnis, Z. W. Ding, C. L. Chang, C. A. Savran, and B. Ziaie, "Laser-treated hydrophobic paper: an inexpensive microfluidic platform," Lab Chip 11, 1161-1165 (2011)

[19] C. L. Sones, I. N. Katis, P. J. W. He, B. Mills, M. F. Namiq, P. Shardlow, M. Ibsen and R. W. Eason, "Laser-induced photo-polymerisation for creation of paper-based fluidic devices", Lab Chip 14 (29 Sep. 2014), DOI: 10.1039/C4LC00850B

[20] GB 1408303.4

[21] GB 1411711.3

[22] WO 2015/173543 A1

[23] GB 1507792.8

[24] P. J. W. He, I. N. Katis, R. W. Eason and C. L. Sones, Biomicrofluidics, 2015, 9, 10.

[25]. P. J. W. He, I. N. Katis, R. W. Eason and C. L. Sones, Lab Chip, 2015, 15, 4054-4061.

The invention claimed is:

1. A method for making a fluid flow device, comprising a plurality of layers made of porous material, the method comprising:
    providing a stack comprising the plurality of layers of porous material, wherein at least part of at least two layers of porous material in the stack are impregnated with a radiation-sensitive substance; and
    after providing the stack, applying a beam of radiation onto at least part of the stack and causing relative translation between the stack and the beam to change the radiation-sensitive substance from a first state to a second state through at least part of the thickness of the stack;
    wherein the beam of radiation is applied to a surface layer of porous material at a surface of the stack to change the radiation-sensitive substance from the first state to the second state in the at least two layers of porous material of the stack;
    wherein the stack includes at least one isolation layer for blocking fluid flow from at least one neighbouring layer made of porous material; and
    wherein the isolation layer comprises at least one hole for permitting fluid flow from the at least one neighbouring layer.

2. A method for making a fluid flow device, comprising a plurality of layers made of porous material, the method comprising:
    providing a stack comprising the plurality of layers of porous material, wherein at least part of at least two layers of porous material in the stack are impregnated with a radiation-sensitive substance; and
    after providing the stack, applying a beam of radiation onto at least part of the stack and causing relative translation between the stack and the beam to change the radiation-sensitive substance from a first state to a second state through at least part of the thickness of the stack;
    wherein the beam of radiation is applied to a surface layer of porous material at a surface of the stack to change the radiation-sensitive substance from the first state to the second state in the at least two layers of porous material of the stack;
    wherein the stack includes at least one isolation layer for blocking fluid flow from at least one neighbouring layer made of porous material; and
    wherein the beam of radiation is applied to change the radiation-sensitive substance from the first state to the second state in at least part of the at least one neighbouring layer to bond the isolation layer to the at least one neighbouring layer.

3. A method for making a fluid flow device, comprising:
    providing a substrate of porous material, the substrate having a first surface and a second surface opposite the first surface;
    applying a beam of radiation onto the first surface of the substrate and causing relative translation between the substrate and the beam, to change a state of a radiation-sensitive substance impregnated in at least part of the substrate extending partially into the substrate from the first surface; and
    applying a beam of radiation onto the second surface of the substrate and causing relative translation between the substrate and the beam, to change a state of a radiation-sensitive substance impregnated in at least part of the substrate extending partially into the substrate from the second surface; in which;
    portions of the substrate in which the radiation-sensitive substance is changed in state by applying the beam of radiation onto the first surface and the second surface define at least one of:
    an enclosed flow-path separated from the first surface and the second surface by said portions of the substrate; or
    a three-dimensional network of channels extending within a single layer of the substrate.

* * * * *